United States Patent
Asahara et al.

(10) Patent No.: US 6,353,642 B1
(45) Date of Patent: Mar. 5, 2002

(54) AUTOMATIC FREQUENCY CONTROLLER AND DEMODULATOR UNIT

(75) Inventors: Takashi Asahara; Toshiharu Kojima, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/394,106

(22) Filed: Sep. 13, 1999

(30) Foreign Application Priority Data

Jun. 29, 1999 (JP) ..................... PCT/JP99/3454

(51) Int. Cl.[7] .......................... H04L 27/06; H04L 27/16
(52) U.S. Cl. ........................ 375/344; 375/326
(58) Field of Search ................ 375/326, 344, 375/355, 362, 365, 366, 371; 370/509, 510, 511, 512, 513; 329/306–308

(56) References Cited

U.S. PATENT DOCUMENTS

| | | | |
|---|---|---|---|
| 5,872,801 A | * | 2/1999 | Mobin ..................... 375/340 |
| 5,898,665 A | * | 4/1999 | Sawahashi et al. ......... 375/371 |
| 6,038,267 A | * | 3/2000 | Oura et al. ................ 375/371 |

FOREIGN PATENT DOCUMENTS

| JP | 5235791 | 9/1993 |
|---|---|---|
| JP | 746285 | 2/1995 |
| JP | 7297870 | 11/1995 |
| JP | 993302 | 4/1997 |
| JP | 10190609 | 7/1998 |

OTHER PUBLICATIONS

Kato, E., et al., "Frequency Offset Compensation Method for QAM in Land Mobile Radio Communications", The Transaction of the Institute of Electronics, Information and Communication of Engineers of Japan (B–II), vol. II, No. 9, Sept. 1991, pp. 493–496.

* cited by examiner

Primary Examiner—Tesfaldet Bocure
(74) Attorney, Agent, or Firm—Rothwell, Figg, Ernst & Manbeck

(57) ABSTRACT

An automatic frequency controller includes a frequency offset estimating section that calculates phase distortion quantities and the average thereof from known signals contained in a received signal. The frequency offset estimating section obtains, from the average distortion quantity, signal powers corresponding to a plurality of candidate frequency offsets set at frequency offset estimation accuracy intervals in a frequency offset estimation range. The frequency offset estimating section looks at the signal powers through a frequency window with a frequency width corresponding to a transmission path state. This makes it possible to maximize the signal power of a frequency of a radio wave or radio waves corresponding to the transmission path state, and to place the radio wave or radio waves corresponding to the transmission path state as a frequency controlled object. This can improve demodulation accuracy. Fine adjustment of the candidate frequency offsets can improve the estimation accuracy of the frequency offset without changing the frequency offset estimation range.

13 Claims, 12 Drawing Sheets

AUTOMATIC FREQUENCY CONTROLLER AND DEMODULATOR UNIT

BACKGROUND OF THE INVENTION

1. Field of the Invention

The present invention relates to an automatic frequency controller applied to digital demodulation processing in satellite communications, mobile satellite communications and mobile land communications, and a demodulator unit for demodulating a signal whose frequency is controlled by the automatic frequency controller.

2. Description of Related Art

Recently, intensive researches of digital modulation and demodulation have been conducted in the field of the satellite communications, mobile satellite communications and mobile land communications. In the environment of mobile communications, in particular, communication signals undergo fading. Hence, various demodulation schemes have been proposed which can achieve stable operation in such a fading environment.

A scheme which has attracted attention makes absolute coherent detection possible even under a fading environment by estimating and compensating for fading distortion using a known signal. To apply the scheme, the fading distortion is estimated and compensated for after carrying out quasi-coherent detection. In this case, it is necessary for achieving highly accurate estimation and compensation of the fading distortion to reduce the frequency offset between the carrier frequency of a received communication signal and the oscillation frequency of a reference signal for the quasi-coherent detection.

However, when only insufficient frequency stability and accuracy can be obtained of an oscillation circuit of a transmitter or receiver, a problem arises that the highly accurate estimation and compensation of the fading distortion cannot be achieved without eliminating the frequency offset by carrying out some processing.

In addition, in mobile communications, transmission and reception are carried out between a fixed station and mobile stations, or between mobile stations. Accordingly, when two stations are moving relatively, the frequency shift of a transmitted signal occurs because of Doppler fluctuations. This causes the frequency offset between the carrier frequency of the received communication signal and the oscillation frequency of the reference signal in spite of the high frequency stability and accuracy of the oscillation circuit of the transmitter and receiver.

A technique for compensating for the frequency offset is disclosed in "Frequency Offset Compensation Method for QAM in Land Mobile Communications", by Kato and Sasaoka, the Transaction of the Institute of Electronics, Information and Communication Engineers of Japan, (B-II), Vol. J74-B-II, No.9, pp.493–496 (September. 1991). The technique disclosed in the prior art document eliminates the frequency offset using the phase fluctuation information of a known signal (pilot signal).

In the conventional technique, a transmitting side inserts into a communication signal a known signal consisting of one symbol at every insertion period $N_F$. On the other hand, a receiving side calculates a phase variation quantity between two different known signals, and rotates the phase of the received signal in accordance with the phase variation quantity calculated, thus eliminating the frequency offset.

In the conventional technique, the estimation range and estimation accuracy of the frequency offset are determined by the insertion period $N_F$ of the known signal. More specifically, considering that the detection range of the phase variation quantity $\Delta\theta$ between the known signals is $-\pi \leq \Delta\theta \leq \pi$, the frequency offset estimation range $f_{DET}$ falls in the range from equal to or greater than $-R_S/2N_F$ (Hz) to equal to or less than $R_S/2N_F$ (Hz) as expressed by the following equation (1).

$$f_{DET} = -\frac{R_S}{2N_F}(\text{Hz}) \sim \frac{R_S}{2N_F}(\text{Hz}) \tag{1}$$

where $R_s$ is a transmission rate of the communication signal.

On the other hand, improvement in the frequency offset estimation accuracy has been desired recently. To achieve this, the effect of noise must be eliminated, which can be carried out by narrowing the frequency offset estimation range $f_{DET}$. To implement this, the insertion period $N_F$ must be increased as clearly seen from equation (1). However, when the insertion period $N_F$ of the known signal is fixed by communication protocols, it cannot be changed, in which the improvement in the frequency offset estimation accuracy is difficult.

Furthermore, the conventional technique does not have any structure for changing the object to be subjected to the frequency offset estimation in response to the state of transmission paths. This presents another problem of making it difficult to sufficiently improve the demodulation quality. In an environment like a so-called Ricean fading environment, in which a direct wave experiencing the Doppler fluctuations is mixed with multipath waves, the improvement in the demodulation quality can be achieved more effectively by identifying a received wave with stronger power and by estimating and compensating for the frequency offset of the received wave.

Therefore, an object of the present invention is to provide, by solving the foregoing technical problems, an automatic frequency controller that can improve frequency offset estimation accuracy without changing the insertion period of the known signal, and carry out elimination processing of the frequency offset in response to the state of transmission paths.

Another object of the present invention is to provide a demodulator unit with improved demodulation accuracy by using the automatic frequency controller.

SUMMARY OF THE INVENTION

To accomplish the objects of the present invention, a frequency offset estimating section is provided for estimating a frequency offset of a received signal including periodic known signals. The frequency offset estimating section obtains the phase fluctuation quantity of each of the plurality of known signals included in the received signal.

The frequency offset estimating section further obtains signal powers corresponding to a plurality of candidate frequency offsets set at predetermined frequency offset estimation accuracy intervals in a frequency offset estimation range that is determined by the insertion period of the known signal.

The frequency offset estimating section sums up, from among the power signals obtained, the signal powers of candidate frequency offsets included in a frequency window with a predetermined frequency width, thereby obtaining window power corresponding to any one of the candidate frequency offsets within the frequency window.

Specifically, the frequency width of the frequency window is set in accordance with the fading state of a transmission path studied in advance, for example. More specifically, the frequency width is set relatively narrow on a transmission path resembling a Gaussian channel in which the power of a direct wave experiencing the Doppler fluctuations is relatively large. In contrast, the frequency width is set relatively wide on a transmission path resembling a Rayleigh fading channel in which the power of multipath waves is relatively large.

The signal power at the frequency of the direct wave can be maximized by summing up the signal powers in each frequency window with the relatively narrow frequency bandwidth, and by associating the window power with the candidate frequency offset at the center of the frequency window, for example. In the opposite case, the signal power at the center frequency of the multipath waves can be maximized.

Thus, the frequency offset estimating section obtains using the frequency window the window powers corresponding to the candidate frequency offsets in the frequency offset estimation range, and detects the candidate frequency offsets corresponding to the maximum value of the window powers. Specifically, the frequency offset estimating section obtains the window powers with shifting the frequency window one by one of the frequency offset estimation accuracy unit. Furthermore, the frequency offset estimating section estimates the detected candidate frequency offsets as the frequency offsets.

This enables the frequency controlled object to be changed in accordance with the fading state of the transmission path, thereby implementing the frequency control appropriate to the fading state of the transmission path. Thus, applying the automatic frequency controller to the demodulator unit can improve the demodulation accuracy.

It is one of the candidate frequency offsets that is estimated as the frequency offset. Therefore, increasing the number of the candidate frequency offsets makes it possible to estimate the frequency offset more precisely. In this case, the number of the candidate frequency offsets in the frequency offset estimation range can be increased with maintaining the range. Thus, the estimation accuracy of the frequency offset can be improved without changing the frequency offset estimation range. As a result, the estimation accuracy of the frequency offset can be improved in an environment in which the insertion period of the known signal is defined by a protocol.

DETAILED DESCRIPTION OF THE PREFERRED EMBODIMENTS

The embodiments in accordance with the invention will now be described with reference to the accompanying drawings.

EMBODIMENT 1

Figure 1:
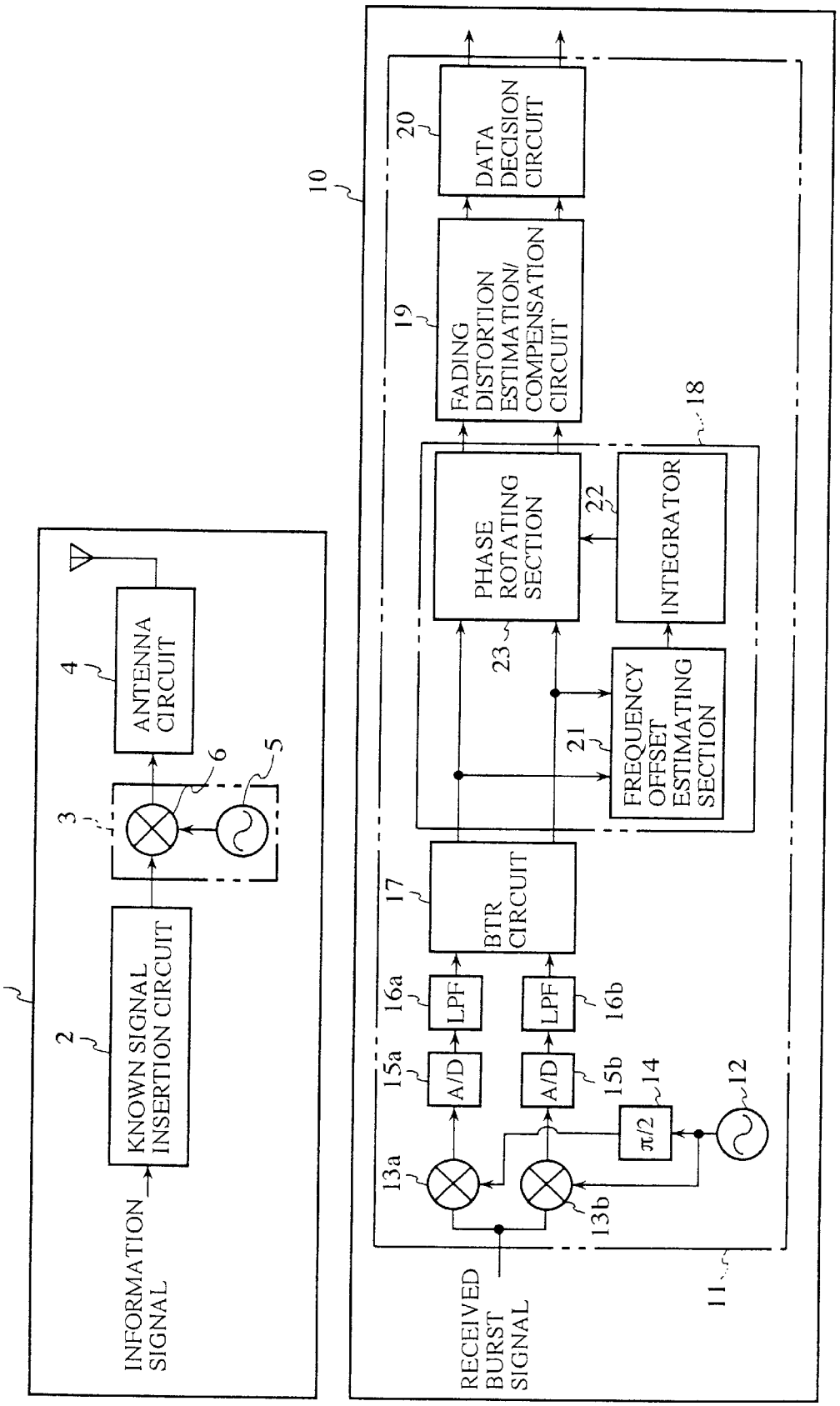
FIG. 1 is a block diagram showing a configuration of a communications system to which an automatic frequency controller of an embodiment 1 in accordance with the present invention is applied.

FIG. 1 is a block diagram showing a configuration of a communications system to which an automatic frequency controller of an embodiment 1 in accordance with the present invention is applied. The communications system comprises a transmitter 1 and a receiver 10, and has a function to estimate in the receiver 10 the frequency offset of a burst signal transmitted from the transmitter 1 at high accuracy, and eliminate it.

More specifically, as the communications system, a satellite communications system, mobile satellite communications system or mobile land communications system is applicable. In the satellite communications system, the transmitter 1 and receiver 10 are applied to earth stations installed in various locations on the ground. In the mobile satellite communications system, the transmitter 1 is applied to one of a mobile station and an earth station installed on the ground, and the receiver 10 is applied to the other of the two. In the mobile land communications system, the transmitter 1 is applied to one of a base station and a mobile station, and the receiver 10 is applied to the other of the two.

As a mobile station in the mobile satellite communications system, a single mode or dual mode satellite mobile phone is applicable. As a mobile station in the mobile land communications system, a mobile phone or PHS (Personal Handyphone System) is applicable.

The communications system employs TDMA (Time Division Multiple Access) as its communications scheme. Thus, the transmitter 1 transmits to the receiver 10 a burst signal synchronized with preassigned time slots. The receiver 10 demodulates the burst signal received (called "received burst signal" from now on), and restores its original information signal after eliminating the frequency offset.

Figure 2:
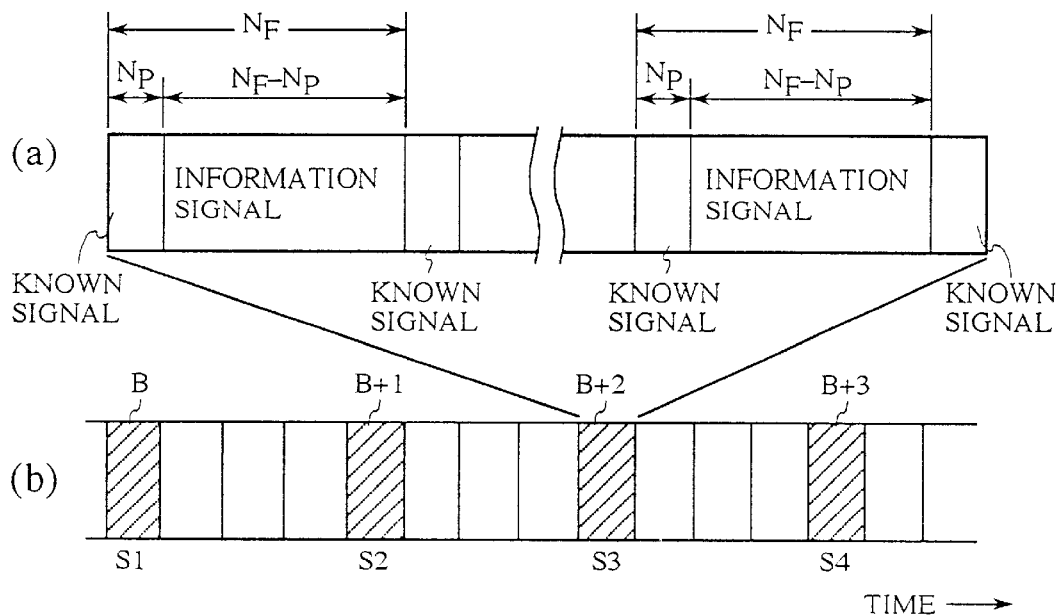
FIG. 2 is a diagram illustrating a format of a burst signal.

The transmitter 1 comprises a known signal insertion circuit 2, a modulator 3 and an antenna circuit 4. The known signal insertion circuit 2 periodically inserts the known signal into an information signal to be transmitted, thereby producing a burst signal before modulation. More specifically, the known signal insertion circuit 2 inserts, as illustrated in FIG. 2(a), the known signal consisting of $N_P$ symbols into the information signal consisting of ($N_F$–$N_P$) symbols at every $N_F$ symbol interval.

The number $N_P$ is an integer equal to or greater than two ($N_P \geq 2$). The time when the known signal is inserted is expressed by ($kN_F$+i)$T_S$, where k represents the insertion sequence of the known signal, i is an integer equal to or greater than zero and equal to or less than ($N_P$–1) ($0 \leq i \leq N_P-1$), and $T_S$ is a symbol period.

The known signal insertion circuit 2 supplies the modulator 3 with the burst signal before the modulation. The modulator 3 modulates the pre-modulation burst signal, and outputs it as a post-modulation burst signal. More specifically, the modulator 3 includes an oscillator 5 and a multiplier 6. The oscillator 5 supplies the multiplier 6 with a local oscillation signal with a predetermined carrier frequency, and the multiplier 6 mixes the local oscillation signal with the pre-modulation burst signal, thereby producing the post-modulation signal.

The modulator 3 supplies the antenna circuit 4 with the produced burst signals in synchronism with the prescribed time slots. Specifically, the modulator 3 supplies the antenna circuit 4 with the burst signals B, B+1, B+2, B+3, . . . in synchronism with preassigned time slots S1, S2, S3, S4, . . . as illustrated in FIG. 2(b). The antenna circuit 4 superimposes the burst signals onto a radio wave, and transmits them to the receiver 10.

The receiver 10 includes a demodulator unit 11 that demodulates the received burst signals by quasi-coherent detection, and restores the original information signal. More specifically, the demodulator unit 11 comprises one oscillator 12, two multipliers 13a and 13b, and one π/2 phase shifter 14, which constitute a frequency converter.

Besides, the demodulator unit 11 further comprises two A/D (Analog/Digital) converters 15a and 15b, two low-pass filters (called "LPF" from now on) 16a and 16b, a bit timing recovery circuit (called "BTR circuit" below), an automatic frequency controller 18, a fading distortion estimation/compensation circuit 19 and a data decision circuit 20.

The oscillator 12 oscillates a local oscillation signal of a predetermined oscillation frequency that is set at the same value as the carrier frequency of the local oscillation signal generated by the oscillator 5 installed in the transmitter 1. The local oscillation signal generated by the oscillator 12 is supplied to the two multipliers 13a and 13b, in which the local oscillation signal is supplied to the I channel multiplier 13a through the π/2 phase shifter 14 that shifts the phase of the local oscillation signal by π/2. Thus, the multipliers 13a and 13b are supplied with the local oscillation signals with their phases shifted by π/2 from each other.

The multipliers 13a and 13b each mixes the received burst signals with the local oscillation signal, thereby generating I-channel and Q-channel analog baseband signals. The analog baseband signals generated are supplied to the A/D converters 15a and 15b.

The A/D converters 15a and 15b convert the analog baseband signals into I-channel and Q-channel digital baseband signals, respectively. The digital baseband signals are passed through the LPF 16a and 16b to eliminate their high frequency components such as noise components above a predetermined cutoff frequency, and are supplied to the BTR circuit 17. The filtering processing in the LPF 16a and 16b includes a wave shaping processing through a Nyquist filter and the like.

The BTR circuit 17 detects the Nyquist points of the digital baseband signal, and outputs digital baseband signals $r(kN_F+i)$ corresponding to the Nyquist points detected. The digital baseband signals $r(kN_F+i)$ are supplied to the automatic frequency controller 18.

The digital baseband signals $r(kN_F+i)$ corresponding to the Nyquist points are expressed by the following equation (2).

$$r(kN_F + i) = Ac(kN_F + i)b(kN_F + i) + n(kN_F + i) \qquad (2)$$
$$= u(kN_F + i)b(kN_F + i) + n(kN_F + i)$$

where $c(kN_F+i)$ is a distortion amount due to fading, $b(kN_F+i)$ is a symbol value, $n(kN_F+i)$ is additive white Gaussian noise, and $u(kN_F+i) \equiv Ac(kN_F+i)$.

The automatic frequency controller 18 comprises a frequency offset estimating section 21, an integrator 22 and a phase rotating section 23. The frequency offset estimating section 21 estimates frequency offsets $f_{OFST}$ using the digital baseband signals $r(kN_F+i)$ output from the BTR circuit 17, and obtains the phase differences $\theta_S(mLN_F)$ which have one to one correspondence with the estimated frequency offsets $f_{OFST}$. More specifically, the frequency offset estimating section 21 estimates the frequency offsets $f_{OFST}$ using the known signal contained in the digital baseband signal $r(kN_F+i)$ at every estimation time mT coming at every estimation period T interval, where m is a natural number.

The frequency offset estimating section 21 obtains the phase differences $\theta_S(mLN_F)$ corresponding to the estimated frequency offsets $f_{OFST}$. Each of the phase differences $\theta_S(mLN_F)$ is the phase difference between two adjacent symbols acquired from the known signals. The frequency offset estimating section 21 supplies the integrator 22 with the phase difference signals including the phase differences $\theta_S(mLN_F)$.

The integrator 22 cyclically adds at every one symbol period the phase differences $\theta_S(mLN_F)$ in the phase difference signals fed from the frequency offset estimating section 21. Specifically, the integrator 22 cyclically sums up the phase differences $\theta_S(mLN_F)$ in accordance with the following equation (3), thereby obtaining cumulative phase differences θ ((mL+l–L)$N_F$+i).

$$\theta((mL+l-L)N_F+i) = \theta((mL+l-L)N_F+i-1) + \theta_S(mLN_F) \qquad (3)$$

where L is the number of known signals included in the estimation period T, l is associated with an identification number having one-to-one correspondence with the known signals and takes a value between zero and (L–1) inclusive ($0 \leq l \leq L-1$).

Thus, the integrator 22 obtains the cumulative phase differences θ (mL+l–L)$N_F$+i) integrated from the estimation time mT at every symbol period $T_S$. The integrator 22 supplies the phase rotating section 23 with the cumulative phase difference signal including the cumulative phase differences θ ((mL+l–L)$N_F$+i).

The phase rotating section 23 eliminates the frequency offsets from the digital baseband signals r((kN_F+i) in response to the cumulative phase differences θ ((mL+l–L)$N_F$+i) in the cumulative phase difference signal. More specifically, the phase rotating section 23 rotates the phases of the digital baseband signals $r(kN_F+i)$ in the reverse direction by amounts corresponding to the cumulative phase differences θ ((mL+l−L)N_F+i). This enables the frequency offsets to be removed from the digital baseband signals r(kN_F+i).

Thus, the phase rotating section 23 obtains the digital baseband signals r(kN_F+i) with their frequency offsets being eliminated as expressed by equation (4). The phase rotating section 23 supplies the fading distortion estimation/compensation circuit 19 with the digital baseband signals $r_R(kN_F+i)$ after eliminating the frequency offsets.

$$r_R(kN_F + i) = r_R((mL + 1 - L)N_F + i) \quad (4)$$
$$= r((mL + 1 - L)N_F + i)\exp[-j\,\theta((mL + 1 - L)N_F + i)]$$

The fading distortion estimation/compensation circuit 19 eliminates the fading distortion from the digital baseband signals $r_R(kN_F+i)$. More specifically, the fading distortion estimation/compensation circuit 19 extracts from the digital baseband signals $r_R(kN_F+i)$ the known signals each consisting of $N_P$ symbols, from which the frequency offsets due to the instability of the oscillator 5 in the transmitter 1 and the oscillator 12 in the receiver 10 have already been eliminated.

The fading distortion estimation/compensation circuit 19 detects the fading distortion from the known signals each consisting of the $N_P$ symbols extracted, and carries out interpolation processing like Gaussian interpolation or wiener interpolation on the basis of the detected fading distortion. Thus, the fading distortion estimation/compensation circuit 19 estimates the fading distortion.

Furthermore, the fading distortion estimation/compensation circuit 19 eliminates the fading distortion estimated, thereby compensating for the fading distortion of the digital baseband signals $r_R(kN_F+i)$. The fading distortion estimation/compensation circuit 19 supplies the data decision circuit 20 with the digital baseband signals with their fading distortion being compensated for. The data decision circuit 20 demodulates (decodes) the digital baseband signals whose fading distortion is compensated for, and decides the original information signal (data).

Figure 3:
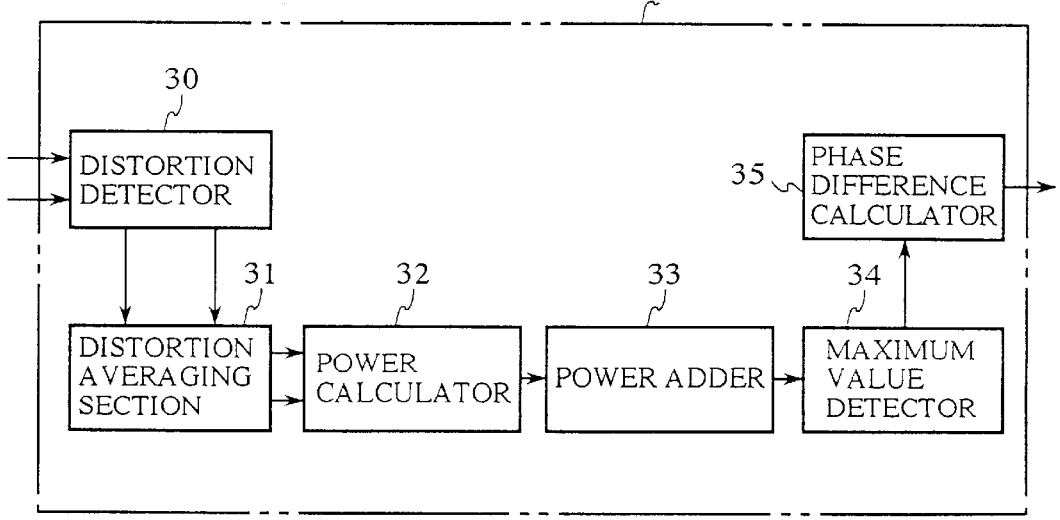
FIG. 3 is a block diagram showing an internal configuration of a frequency offset estimating section.

FIG. 3 is a block diagram showing an internal configuration of the frequency offset estimating section 21. The frequency offset estimating section 21 comprises a distortion detector 30, a distortion averaging section 31, a power calculator 32, a power adder 33, a maximum value detector 34 and a phase difference calculator 35.

The distortion detector 30 detects distortion amounts $c_{EPi}(kN_F+i)$ of the transmission paths for individual symbols included in the known signals using the known signals each consisting of $N_P$ symbols included in the digital baseband signals r(kN_F+i) output from the BTR circuit 17. Specifically, the distortion detector 30 detects, as expressed by the following equation (5), the distortion amounts of the amplitude and phase of the digital baseband signals r(kN_F+i) as the distortion amounts $C_{EPi}(kN_F+i)$.

$$C_{EPi}(kN_F + i) = \frac{r(kN_F + i)}{b_P} = u(kN_F + i) + \frac{n(kN_F + i)}{b_P} \quad (5)$$

where $b_P$ is the value of the known signal.

The distortion detector 30 supplies the distortion averaging section 31 with the detected distortion amounts $c_{EPi}(kN_F+i)$ of the transmission paths. The distortion averaging section 31 averages the distortion amounts $c_{EPi}(kN_F+i)$ of the transmission paths fed from the distortion detector 30 for each of the known signals, thereby obtaining the average distortion amount $c_{EP}(kN_F)$. Specifically, the distortion averaging section 31 adds the distortion amounts $c_{EPi}(kN_F+i)$ corresponding to the individual symbols, and divides the addition result by the number of symbols $N_P$ of the known signal as the following equation (6).

$$C_{EP}(kN_F) = \frac{1}{N_P}\sum_{i=0}^{N_P-1} C_{EPi}(kN_F + i) \quad (6)$$

Thus, the distortion averaging section 31 obtains the average distortion amount $c_{EP}(kN_F)$ for each of the known signals whose noise is eliminated. The distortion averaging section 31 supplies the power calculator 32 with the average distortion amounts $c_{EP}(kN_F)$ obtained.

Figure 4:
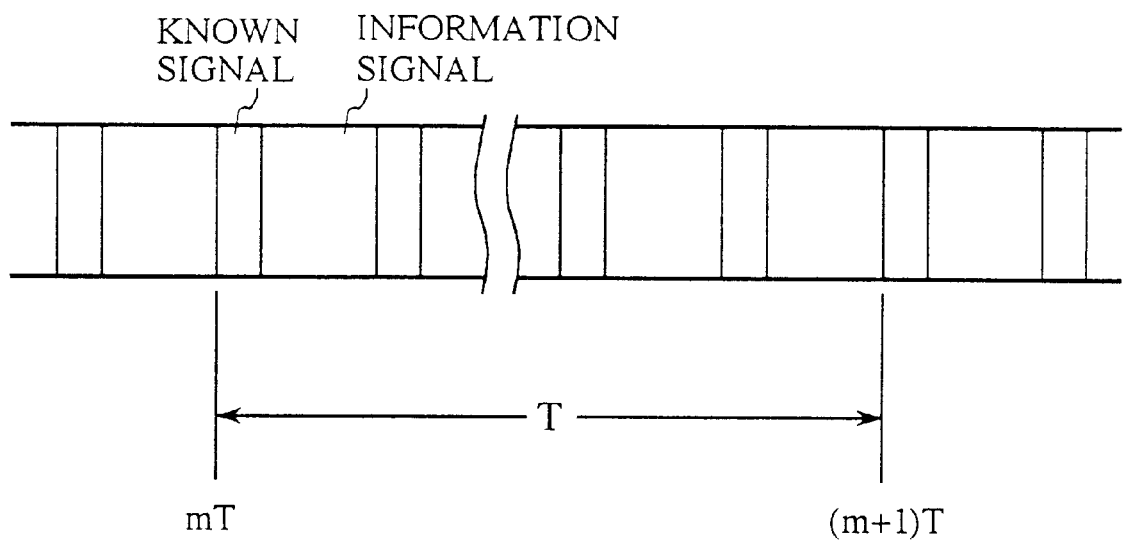
FIG. 4 a schematic diagram illustrating an estimation processing of the frequency offset.

The power calculator 32 calculates from the average distortion amounts $c_{EP}(kN_F)$ fed from the distortion averaging section 31 the signal power corresponding to candidate frequency offsets $n\Delta f_{RES}$ of a predetermined number. Specifically, the power calculator 32 collects, as shown in FIG. 4, the average distortion amounts $c_{EP}(kN_F)$ fed from the distortion averaging section 31 for the estimation period T from estimation time (m−1)T to mT. Assuming the number of the known signals in the estimation period T is L, the power calculator 32 obtains L average distortion amounts $c_{EP}((mL+l−L)N_F)$, where $0 \le l \le L$.

Subsequently, the power calculator 32 conducts the phase rotation of each of the collected L average distortion amounts $c_{EP}((mL+l−L)N_F)$ using a plurality of phase rotation quantities Δθ (n,l). Specifically, the power calculator 32 carries out phase rotation of each of the average distortion amounts $c_{EP}((mL+l−L)N_F)$ in accordance with the phase rotation quantities Δθ (n,l) corresponding to the n candidate frequency offsets $n\Delta f_{RES}$ that are set in the predetermined frequency offset estimation range $f_{DET}$, where n is a natural number greater than one.

Figure 5:
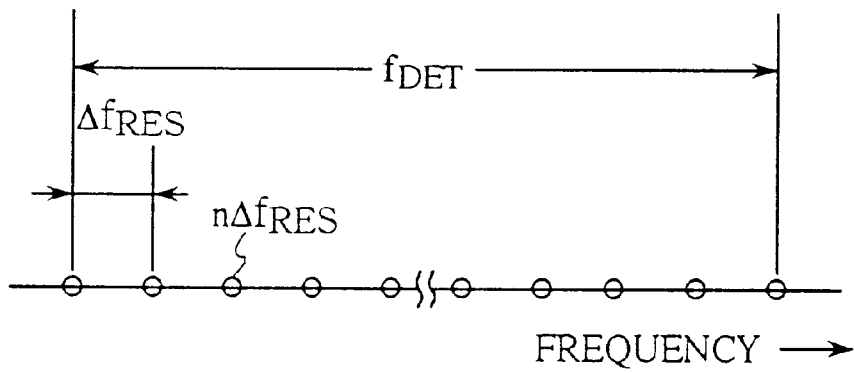
FIG. 5 is a schematic diagram illustrating relationships between a frequency offset estimation range, frequency offset estimation accuracy and candidate frequency offsets.

FIG. 5 is a diagram illustrating the relationships between the frequency offset estimation range $f_{DET}$, frequency offset estimation accuracy $\Delta f_{RES}$, and candidate frequency offsets $n\Delta f_{RES}$. The frequency offset estimation range $f_{DET}$, which is determined by the insertion period $N_F$ of the known signal, has the range given by equation (1) in the foregoing "related art" section. The candidate frequency offsets $n\Delta f_{RES}$ are preset at every frequency offset estimation accuracy $\Delta f_{RES}$ interval in the frequency offset estimation range $f_{DET}$. The phase rotation quantities Δθ (n,l) are constants given by the following equation (7) based on the candidate frequency offsets $n\Delta f_{RES}$.

$$\Delta\theta(n, l) = \frac{2\pi l N_F n \Delta f_{RES}}{R_S} \quad (7)$$

In addition, the frequency offset estimation range $f_{DET}$ can be expressed using the frequency offset estimation accuracy $\Delta f_{RES}$. Specifically, the frequency offset estimation range $f_{DET}$ can be expressed that it is included in the range from $-M\Delta f_{RES}$(Hz) to $M\Delta f_{RES}$(Hz) inclusive, where the constant M is given by the following equation (8).

$$M \cong \frac{R_S}{2N_F \Delta f_{RES}} \quad (8)$$

Returning to FIG. 3, the power calculator 32 rotates in the reverse direction the phase of the individual average distortion amounts $c_{EP}((mL+l−L)N_F)$ in accordance with the phase rotation quantities Δθ (n,l) corresponding to the n candidate frequency offsets $n\Delta f_{RES}$ set in the frequency offset estimation range $f_{DET}$. The power calculator 32 forms a group of the signal vectors associated with the same candidate frequency offset $n\Delta f_{RES}$ from among the signal vectors corresponding to the reversely rotated average distortion amounts $c_{EP}((mL+l-L)N_F)$, and composites the signal vectors in the group. As a result, it obtains signal powers $P_f(n)$ corresponding to the individual candidate frequency offsets $n\Delta f_{RES}$ averaged over the estimation period T.

The signal powers $P_f(n)$ are proportional to the amplitudes corresponding to the differences between the phase rotation quantities of the average distortion amounts $c_{EP}((mL+l-L)N_F)$ and the phase rotation quantities $\Delta\theta$ (n,l) corresponding to the individual candidate frequency offsets $n\Delta f_{RES}$. Specifically, the signal powers $P_f(n)$ take a greater amplitude as the difference between the phase rotation quantities of the average distortion amounts $c_{EP}((mL+l-L)N_F)$ and the phase rotation quantities $\Delta\theta$ (n,l) corresponding to the individual candidate frequency offsets $n\Delta f_{RES}$ approaches zero. Thus, the phase rotation quantities of the average distortion amounts $c_{EP}((mL+l-L)N_F)$, that is, the frequency offsets of the average distortion amounts $c_{EP}((mL+l-L)N_F)$ can be expressed in terms of the signal powers. The power calculator 32 supplies the power adder 33 with the signal powers $P_f(n)$ corresponding to the candidate frequency offsets $n\Delta f_{RES}$.

The foregoing process in the power calculator 32 can be summarized in the following equation (9).

$$P_f(n) = \left| \sum_{l=0}^{L-1} C_{EP}((m+1)N_F) \exp\left(-j\frac{\Delta\theta(n,1)}{R_S}\right) \right|^2 ; \quad (9)$$
$$-M - W \le n \le M + W$$

where W is a constant for determining the frequency width $\Delta f$ of a frequency window as will be described later.

As described above, by introducing the concept of the frequency offset estimation accuracy $\Delta f_{RES}$, are obtained the signal powers $P_f(n)$ corresponding to the candidate frequency offsets $n\Delta f_{RES}$ separated apart at every frequency offset estimation accuracy $\Delta f_{RES}$ interval. Thus, comparing the signal powers $P_f(n)$ and checks their maximum value makes it possible to estimate the frequency offset. This enables the estimation accuracy of the frequency offset to be improved by setting the frequency offset estimation accuracy $\Delta f_{RES}$ at a small value.

Figure 6:
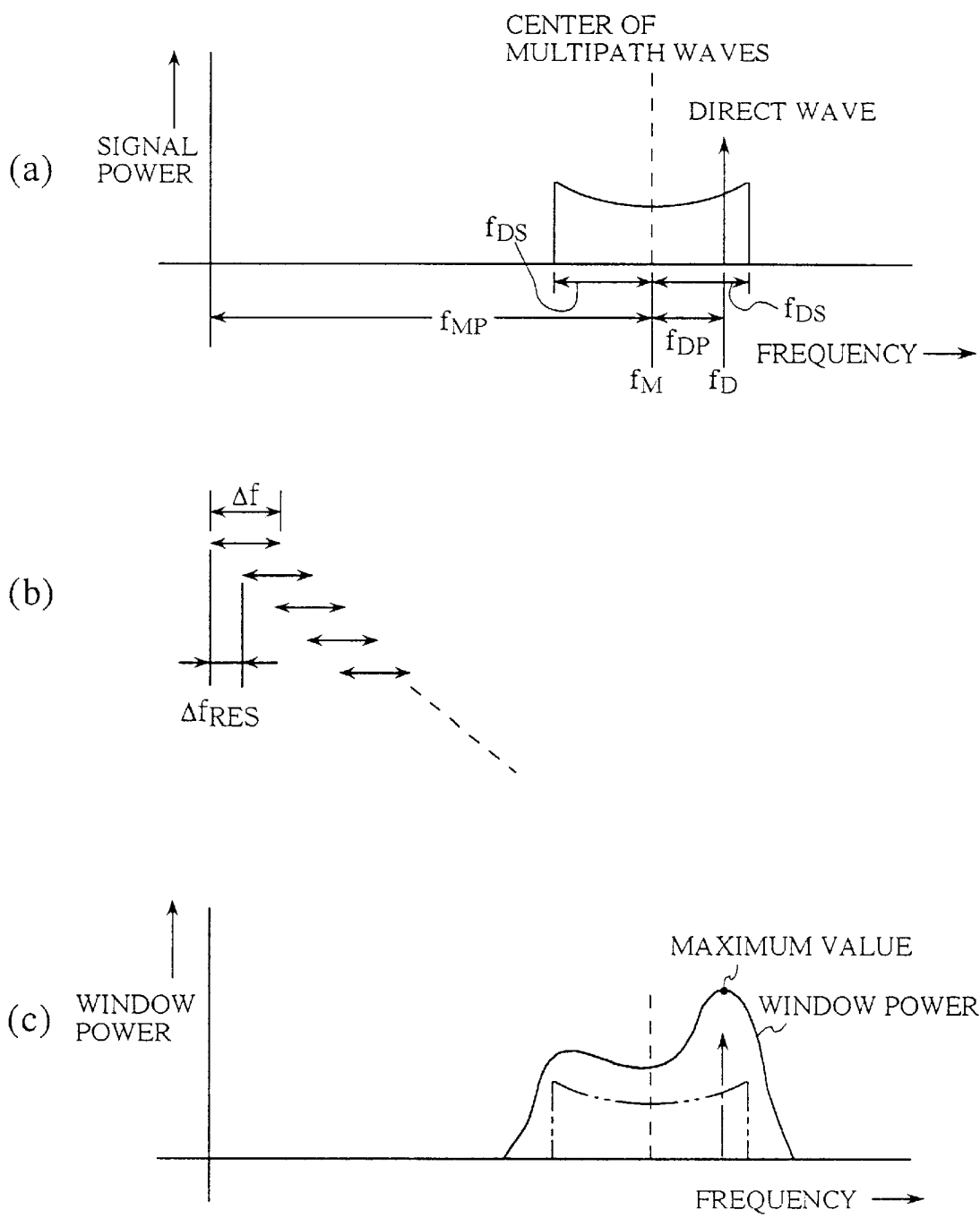
FIG. 6 are diagrams illustrating a frequency offset estimation processing when setting the frequency width of a frequency window at a relatively narrow width.
Figure 7:
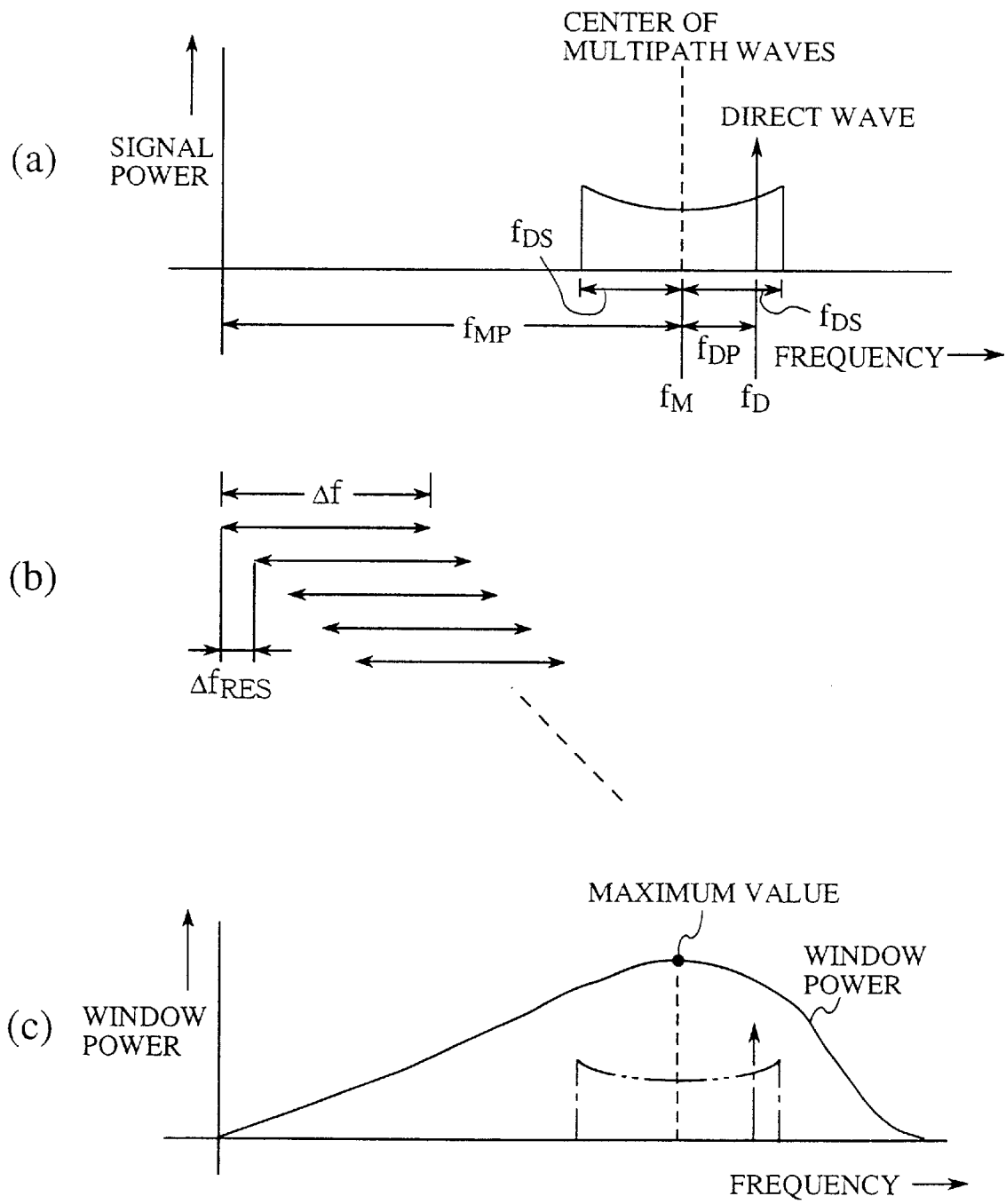
FIG. 7 are diagrams illustrating a frequency offset estimation processing when setting the frequency width of the frequency window at a relatively wide width.

Incidentally, among the transmission paths of a radio wave, there are transmission paths present in the Ricean fading environment in which the direct wave is combined with multipath waves. In this case, the direct wave usually undergoes the Doppler fluctuations. Therefore, the frequency $f_D$ of the direct wave further deviates by an amount of a Doppler frequency width $f_{DP}$ from the frequency offset $f_{MP}$ due to the instability of the oscillators as illustrated in FIGS. 6(a) and 7(a), although the center frequency $f_M$ of the multipath wave corresponds to the frequency offset $f_{MP}$ as illustrated in FIGS. 6(a) and 7(a).

On the one hand, in such a Ricean fading environment, the direct wave and the multipath waves are sometimes received at different powers. The difference between the received powers are partially due to ground objects between the transmitter 1 and the receiver 10. The demodulation quality usually gets better by selecting the radio signal with greater power as the controlled object. Thus, to improve the demodulation quality, the objective radio signal of the frequency control must be changed in response to the fading state of the transmission paths.

On the other hand, the direct wave and the multipath waves have different frequency offset values to be eliminated. Accordingly, to distinct the objective radio wave to be subjected to the frequency control, it is necessary to enable the frequency $f_D$ of the direct wave and the center frequency $f_M$ of the multipath waves to be estimated individually in terms of the frequency offset.

Considering this, in the present embodiment 1, the signal powers $P_f(n)$ are seen through a frequency window with a predetermined frequency width $\Delta f$, so that the frequency $f_D$ of the direct wave and the center frequency $f_M$ of the multipath waves can be estimated individually in terms of the frequency offset.

More specifically, the power adder 33 obtains, from the signal powers $P_f(n)$ corresponding to the candidate frequency offsets $n\Delta f_{RES}$, window powers $E_f(n)$ having one-to-one correspondence with the frequency windows of the predetermined frequency width $\Delta f$. The frequency width $\Delta f$ is 2 W times as large as the frequency offset estimation accuracy $\Delta f_{RES}$, where W is a constant set in response to the fading state of the transmission paths.

In this case, the fading state of the transmission paths can be obtained in advance by studying it before constructing the present communications system. Specifically, the constant W is set at a comparatively small value when the direct wave is the controlled object, whereas it is set at a comparatively large value when the multipath waves are the controlled object.

More specifically, when the direct wave is the controlled object, the constant W is set such that the frequency width $\Delta f$ becomes about 0.2 times the Doppler spread caused by the multipath waves ($W=f_{DS}/(10\Delta f_{RES})$). In contrast, when the multipath wave is the controlled object, the constant W is set such that the frequency width of $\Delta f$ becomes about 2 times the Doppler spread due to the multipath waves ($W=f_{DS}/\Delta f_{RES}$).

The power adder 33 sums up the signal powers $P_f(n)$ corresponding to all the candidate frequency offsets $n\Delta f_{RES}$ included in the frequency window. The power adder 33 iterates the addition with shifting the frequency window one by one for every frequency offset estimation accuracy $\Delta f_{RES}$. In this case, the window powers $E_f(n)$ are each associated with the candidate frequency offset $n\Delta f_{RES}$ corresponding to the center of the frequency window. In other words, the power adder 33 carries out the processing in accordance with the following equation (10).

$$E_f(n) = \sum_{k=-W}^{W} P_f(n+k); -M \le n \le M \quad (10)$$

The foregoing processing makes it possible to maximize the signal power corresponding to the frequency $f_D$ of the direct wave or to the center frequency $f_M$ of the multipath waves in accordance with the frequency width $\Delta f$ of the frequency windows.

More specifically, relatively reducing the frequency width $\Delta f$ of the frequency windows as illustrated in FIG. 6(b) is equivalent to narrowing the frequency passband of the filter. This enables the signal power corresponding to the frequency $f_D$ of the direct wave to be increased as illustrated in FIG. 6(c). In contrast with this, relatively increasing the frequency width $\Delta f$ of the frequency windows as illustrated in FIG. 7(b) is equivalent to broadening the frequency passband of the filter. This enables the center of a block of the signal powers like the multipath waves, that is, the signal power corresponding to the center frequency $f_M$ of the multipath waves to be increased as illustrated in FIG. 7(c).

Thus obtaining the window powers $E_f(n)$ by summing up the signal powers with shifting the frequency window one by one for every frequency offset estimation accuracy $\Delta f_{RES}$ enables the signal powers of the candidate frequency offsets $n\Delta f_{RES}$ required to be maximized. The power adder 33 supplies the maximum value detector 34 with the window powers $E_f(n)$ obtained.

The maximum value detector 34 obtains the maximum value $E_f(n_{MAX})$ of the signal powers fed from the power adder 33 in the frequency offset estimation range $f_{DET}$ as the following equation (11).

$$E_f(n_{MAX}) = \text{Max}[E_f(n)] \tag{11}$$

The maximum value detector 34 estimates the candidate frequency offset $n_{MAX}\Delta f_{RES}$ corresponding to the maximum value $E_f(n_{MAX})$ as the frequency offset $f_{OFST}$.

$$f_{OFST} = n_{MXA\Delta fRES} \tag{12}$$

Thus, the frequency offset adaptive to the fading state of the transmission paths can be obtained. The maximum value detector 34 supplies the phase difference calculator 35 with the frequency offset $f_{OFST}$ estimated.

The phase difference calculator 35 calculates the phase difference $\theta_S(mLN_F)$ using the frequency offset fed from the maximum value detector 34 by the following equation (13).

$$\theta_S(mLN_F) = f_{OFST} \times \frac{2\pi}{R_S} \tag{13}$$

The phase difference $\theta_S(mLN_F)$ calculated is supplied to the integrator 22. The phase rotating section 23 carries out the reverse phase rotation processing using the phase difference $\theta_S(mLN_F)$ as described before.

As described above, the present embodiment 1 estimates the frequency offset of the received signal from the signal powers $P_f(n)$ corresponding to the candidate frequency offsets $n\Delta f_{RES}$ which are set at every frequency offset estimation accuracy $\Delta f_{RES}$ interval. Thus, setting the frequency offset estimation accuracy $\Delta f_{RES}$ at a small value makes it possible to estimate the frequency offset to a very small value. This can improve the estimation accuracy of the frequency offset.

Furthermore, the present embodiment not only obtains the signal powers $P_f(n)$ corresponding to the frequency offsets, but also estimates, as the frequency offset $f_{OFST}$, the frequency $f_D$ of the direct wave and the center frequency $f_M$ of the multipath waves by setting the frequency windows. This makes it possible to obtain the frequency offset in accordance with the fading state of the transmission paths, which enables the frequency offset of the received signal to be compensated for in response to the fading state of the transmission paths. As a result, the fading distortion estimation/compensation circuit 19 can appropriately compensate for the fading distortion of the digital baseband signal. Hence, the data decision circuit 20 can make a good decision of the data, thereby improving the demodulation accuracy.

Moreover, since the distortion amounts of the transmission paths are detected by averaging the distortion amounts of the known signals each consisting of a plurality of symbols, the frequency offset can be estimated in a short time even under a low C/N environment.

EMBODIMENT 2

Figure 8:
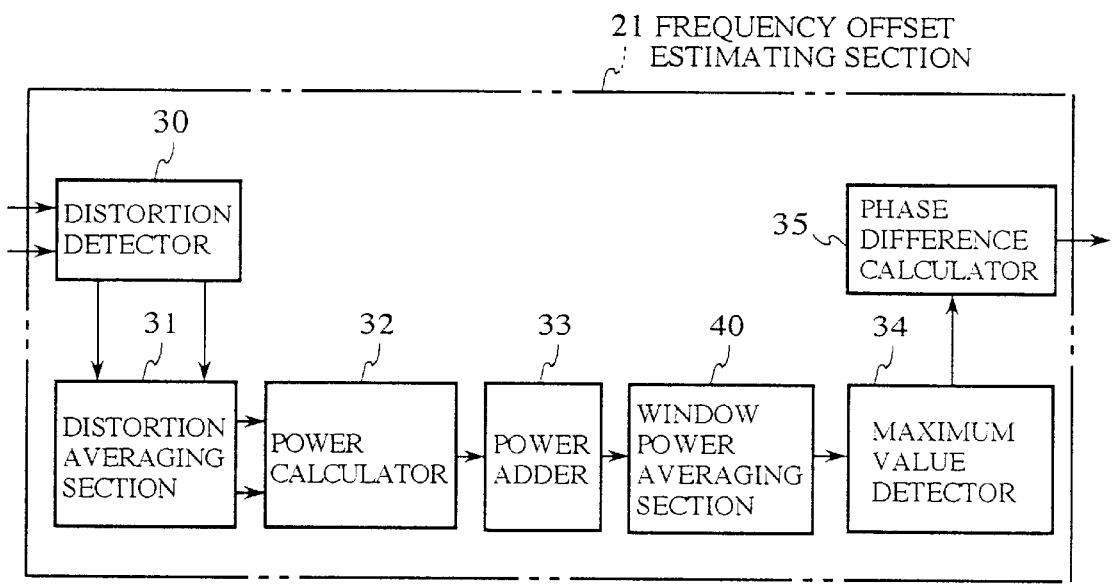
FIG. 8 is a block diagram showing an internal configuration of the frequency offset estimating section installed in the automatic frequency controller of an embodiment 2 in accordance with the present invention.

FIG. 8 is a block diagram showing a configuration of the frequency offset estimating section 21 installed in the automatic frequency controller of an embodiment 2 in accordance with the present invention. In other words, FIG. 8 is a drawing to be put in the place of FIG. 3 in the foregoing embodiment 1.

In the foregoing embodiment 1, the maximum value $E_f(n_{MAX})$ is detected from among the window powers $E_f(n)$ which are each obtained by the one-time window power operation processing carried out by the power adder 33. On the other hand, the present embodiment 2 averages the window powers $E_f(n)$ between the received burst signals using a forgetting factor $\lambda$ to improve the estimation accuracy of the frequency offset.

More specifically, the frequency offset estimating section 21 comprises a window power averaging section 40 which is disposed between the power adder 33 and the maximum value detector 34. The window power averaging section 40 is supplied with the window powers $E_f(n)$ from the power adder 33.

The window power averaging section 40 holds the window powers $E_f(n)$ fed from the power adder 33 until at least the next received burst signal is received. The window power averaging section 40 obtains using the following equation (14) the average window power $<E_f(n)>_B$ from the window power $E_f(n)$ at the time when the current received burst signal B is received and from the average window power $<E_f(n)>_{B-1}$ at the time when the first previous received burst signal (B−1) is received.

$$<E_f(n)>_B = E_f(n) + \lambda <E_f(n)>_{B-1} \tag{14}$$

where, $\lambda$ is a forgetting factor which is equal to or greater than zero and less than one.

The window power averaging section 40 supplies the maximum value detector 34 with the average window power $<E_f(n)>_B$ obtained. The maximum value detector 34 detects the maximum value $<E_f(n_{MAX})>_B$ from among the average window powers $<E_f(n)>_B$ fed from the window power averaging section 40 using the following equation (15).

$$<E_f(n_{MAX})>_B = \text{Max}[<E_f(n)>_B] \tag{15}$$

Subsequently, the maximum value detector 34 estimates the frequency offset $f_{OFST}$ from the maximum value $<E_f(n_{MAX})>_B$, and supplies the frequency offset $f_{OFST}$ to the phase difference calculator 35.

Thus, the present embodiment 2 averages the window powers with gradually forgetting them using the forgetting factor $\lambda$. This enables the averaging processing of the window powers to follow the temporal fluctuations even under the time varying fading state, thereby obtaining the window power better matching the transmission path state. As a result, the present embodiment 2 can estimate the frequency offset at high accuracy in the low C/N environment.

EMBODIMENT 3

Figure 9:
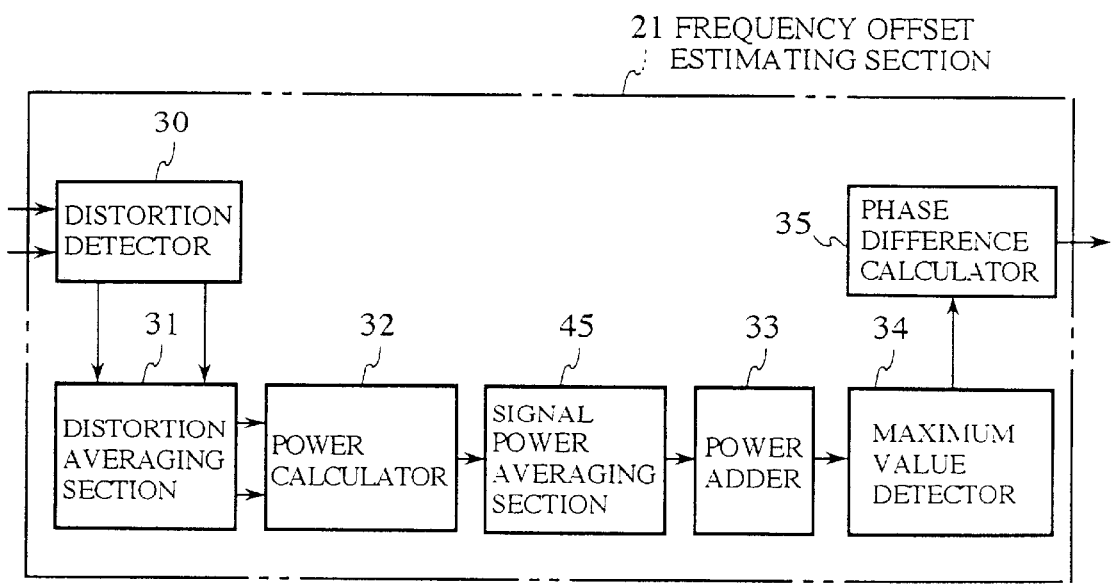
FIG. 9 is a block diagram showing an internal configuration of the frequency offset estimating section installed in the automatic frequency controller of an embodiment 3 in accordance with the present invention.

FIG. 9 is a block diagram showing a configuration of the frequency offset estimating section 21 installed in the automatic frequency controller of an embodiment 3 in accordance with the present invention. In other words, FIG. 9 is a drawing to be put in the place of FIG. 3 in the foregoing embodiment 1.

In the foregoing embodiment 2, the estimation accuracy of the frequency offset is improved by eliminating the effect of noise by averaging the window powers $E_f(n)$. Improving the estimation accuracy of the frequency offset by eliminating the effect of the noise can also be achieved by averaging the signal powers $P_f(n)$. Thus, the present embodiment 3 averages the signal powers $P_f(n)$ between the received burst signals to eliminate the effect of the noise, thereby improving the estimation accuracy of the frequency offset.

More specifically, the frequency offset estimating section 21 comprises a signal power averaging section 45 which is disposed between the power calculator 32 and the power adder 33. The signal power averaging section 45 is supplied with the signal powers $P_f(n)$ from the power calculator 32.

The signal power averaging section 45 holds the signal powers $P_f(n)$ until at least the next received burst signal is received. The signal power averaging section 45 obtains using the following equation (16) the average signal power $<P_f(n)>_B$ from the signal powers $P_f(n)$ at the time when the current received burst signal B is received and from the average signal power $<P_f(n)>_{B-1}$ at the time when the first previous received burst signal (B-1) is received.

$$P_f(n)_B = P_f(n) + \lambda < P_f(n)>_{B-1} \tag{16}$$

The signal power averaging section 45 supplies the power adder 33 with the average signal power $<P_f(n)>_B$ obtained. The power adder 33 obtains the window powers $E_f(n)$ from the average signal powers $<P_f(n)>_B$.

Thus, the present embodiment 3 averages the past signal powers with gradually forgetting them using the forgetting factor $\lambda$. This enables the averaging processing of the signal powers to follow the temporal fluctuations even under the time varying fading state, thereby obtaining the signal power better matching the transmission path state. As a result, the present embodiment 3 can estimate the frequency offset at high accuracy even under the low C/N environment.

EMBODIMENT 4

Figure 10:
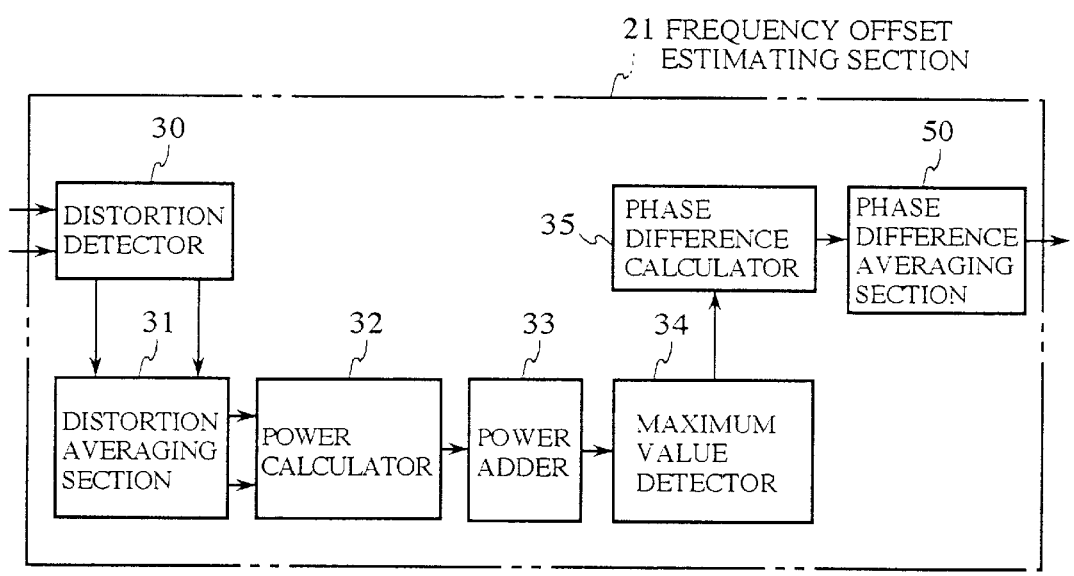
FIG. 10 is a block diagram showing an internal configuration of the frequency offset estimating section installed in the automatic frequency controller of an embodiment 4 in accordance with the present invention.

FIG. 10 is a block diagram showing a configuration of the frequency offset estimating section 21 installed in the automatic frequency controller of an embodiment 4 in accordance with the present invention. In other words, FIG. 10 is a drawing to be put in the place of FIG. 3 in the foregoing embodiment 1.

In the foregoing embodiments 1–3, the phase differences $\theta_S(mLN_F)$ calculated by the phase difference calculator 35 are supplied to the integrator 22 every time they are calculated. In contrast with this, the present embodiment 4 averages the phase differences $\theta_S(mLN_F)$ calculated by the phase difference calculator 35, and then supplies the average value to the integrator 22.

More specifically, the frequency offset estimating section 21 comprises a phase difference averaging section 50 which is disposed behind the phase difference calculator 35. The phase difference averaging section 50 is supplied with the phase differences $\theta_S(mLN_F)$ from the phase difference calculator 35. The phase difference averaging section 50 holds the phase differences $\theta_S(mLN_F)$ for at least the estimation periods 2 MT. The phase difference averaging section 50 obtains using the following equation (17) an average phase difference $<\theta_S(mLN_F)>$ from the phase differences $\theta_S(mLN_F)$ obtained at the estimation time mT and from the phase differences at the previous estimation times (m+i), which are held, where $-M \leq i \leq M$.

$$\langle \theta_S(mLN_F) \rangle = \frac{1}{2M+1} \sum_{i=-M}^{M} \theta_S((m+i)LN_F) \tag{17}$$

where 2M+1 is the total number of the phase differences $\theta_S(mLN_F)$ used for the averaging.

The phase difference averaging section 50 supplies the integrator 22 with the average phase difference $<\theta_S(mLN_F)>$ obtained. Thus, the phase rotating section 23 carries out the phase rotation processing using the average phase difference $<\theta_S(mLN_F)>$.

Thus, the present embodiment 4 carries out the phase rotation processing using the average phase difference $<\theta_S(mLN_F)>$. This makes it possible to reduce the effect of the phase variations due to fading fluctuations and the effect of noise. As a result, the present embodiment 4 can reduce the estimation error of the frequency offset, thereby enabling the high accuracy frequency offset estimation.

EMBODIMENT 5

Figure 11:
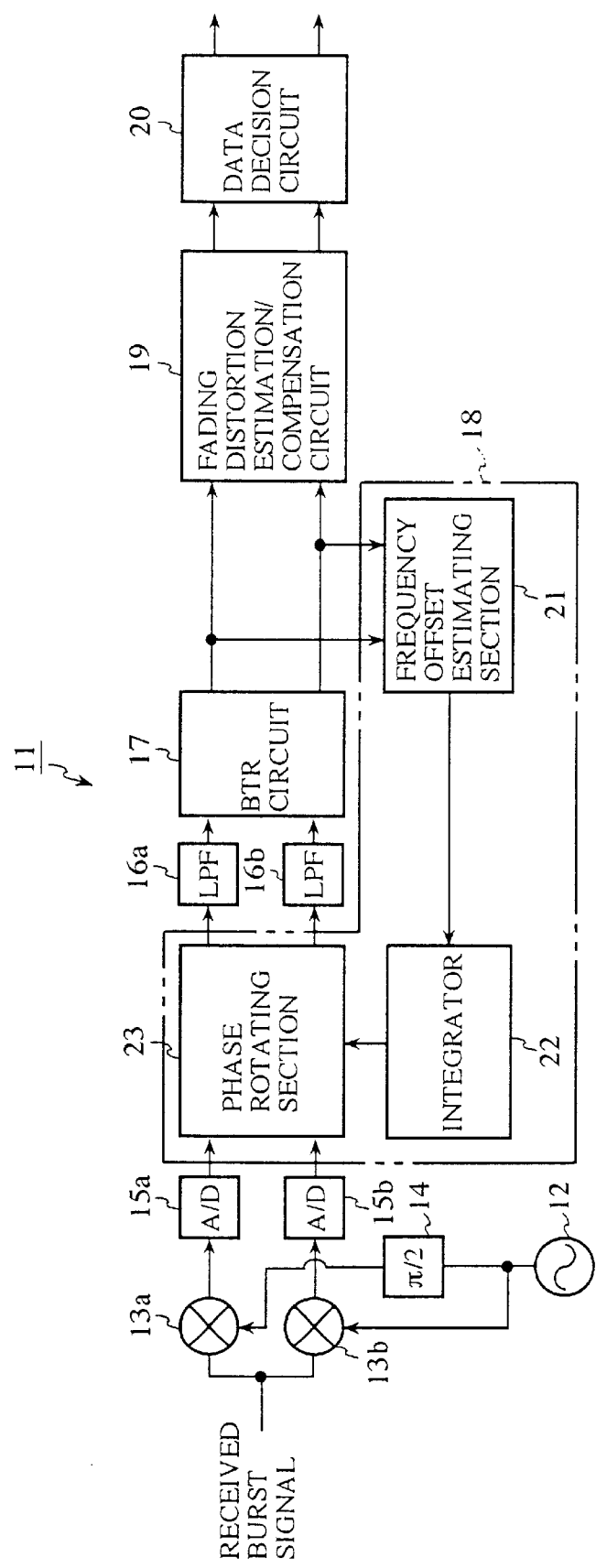
FIG. 11 is a block diagram showing a configuration of the demodulator unit of an embodiment 5 in accordance with the present invention.

FIG. 11 is a block diagram showing a configuration of a demodulator unit 11 to which the automatic frequency controller 18 of an embodiment 5 in accordance with the present invention is applied. In FIG. 11, the same functional blocks as those of FIG. 1 are designated by the same reference numerals.

In the foregoing embodiments 1–4, the phase rotating section 23 for rotating the phase of the received signal is disposed behind the LPFs 16a and 16b. In contrast with this, the phase rotating section 23 is disposed in front of the LPFs 16a and 16b in the present embodiment 5.

The frequency offset of the received burst signals occurs from the instability of the oscillator 5 in the transmitter 1 and the oscillator 12 in the receiver 10 as described before in the "related art" section. In particular, using low cost oscillators often causes large frequency offsets because of their low frequency stability. In addition, the frequency stability of the oscillators are affected by the environmental conditions such as ambient temperature and variations in the supply power voltages. Thus, it is very probable that small frequency offsets at the initial stage will increase with the elapse of time, in which case the frequency band of the received burst signal can broaden beyond the cutoff frequency of the LPFs 16a and 16b. This will cutoff part of the received burst signals passing through the LPFs 16a and 16b, and hence can degrade the data decision.

In view of this, the present embodiment 5 disposes the phase rotating section 23 before the LPFs 16a and 16b to carry out the filtering after eliminating the frequency offsets.

More specifically, the phase rotating section 23 is disposed between the A/D converters 15a and 15b and the LPFs 16a and 16b. The phase rotating section 23 is supplied from the A/D converters 15a and 15b with the I-channel and Q-channel digital baseband signals, and rotates the phases of the digital baseband signals in the reverse direction in accordance with the phase rotation quantities fed from the integrator 22. As a result, the digital baseband signals whose frequency offsets are eliminated can be obtained.

Subsequently, the BTR circuit 17 extracts Nyquist points from the digital baseband signals whose frequency offsets have been eliminated, and the fading distortion estimation/compensation circuit 19 estimates and compensates for the fading distortion, followed by the data decision by the data decision circuit 20.

As described above, the present embodiment 5 carries out the elimination of the frequency offsets from the digital baseband signals before the LPFs 16a and 16b. Accordingly, even if the frequency band of the received signal increases beyond the cutoff frequency of the LPFs 16a and 16b, the frequency offsets can be eliminated without cutting off part of the received burst signal. This enables good data decision.

EMBODIMENT 6

Figure 12:
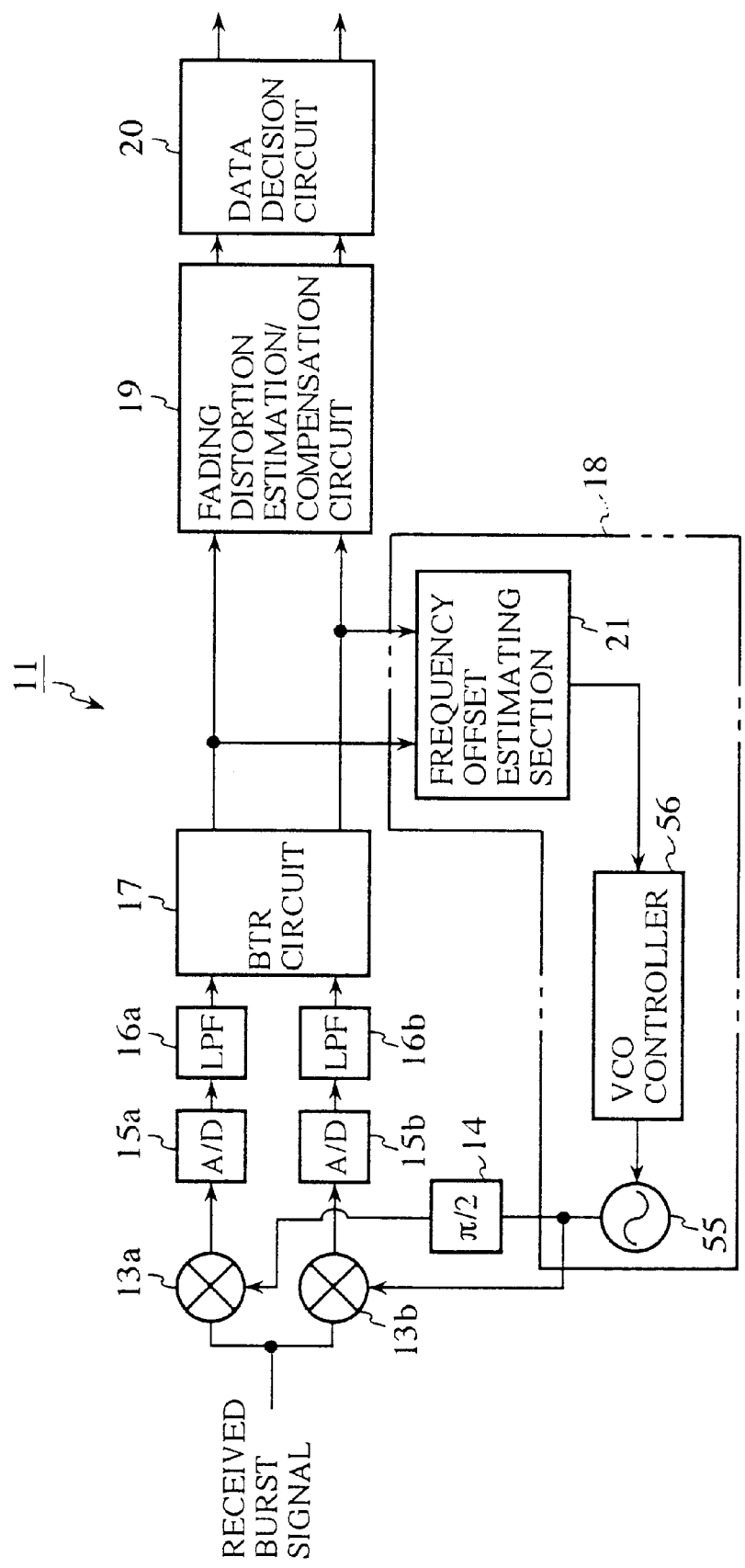
FIG. 12 is a block diagram showing a configuration of the demodulator unit of an embodiment 6 in accordance with the present invention.

FIG. 12 is a block diagram showing a configuration of the demodulator unit 11 to which the automatic frequency controller 18 of an embodiment 6 in accordance with the present invention is applied. In FIG. 12, the same functional blocks as those of FIG. 1 are designated by the same reference numerals.

In the foregoing embodiments 1–5, the frequency offsets are compensated for directly by rotating the phases of the digital baseband signals. In contrast with this, in the present embodiment 6, the frequency offsets are indirectly compensated for by rotating the phase of the received burst signals by varying the frequency of the local oscillation signal generated by a VCO 55.

More specifically, the demodulator unit 11 comprises the VCO 55 and a VCO controller 56. The VCO 55 generates the local oscillation signal of a carrier frequency corresponding to an applied voltage. The VCO controller 56 receives the phase difference signal output from the frequency offset estimating section 21, and controls the applied voltage to the VCO 55 in response to the phase difference included in the phase difference signal.

This varies the carrier frequency of the local oscillation signal, thereby varying the phase of the local oscillation signal. The degree of the variation in this case is proportional to the phase difference. On the other hand, the local oscillation signal is mixed with the received burst signals, which is equivalent to rotating the phase of the received burst signals indirectly. Thus, the frequency offset can be eliminated from the received burst signals.

As described above, the present embodiment 6 eliminates the frequency offset from the received burst signals by adjusting the frequency of the local oscillation signal generated by the VCO 55. In other words, the frequency offset is removed in a stage before the LPFs 16*a* and 16*b*. Therefore, as in the foregoing embodiment 5, the frequency offsets can be eliminated without cutting off part of the received burst signals, even if the frequency band of the received burst signals broadens beyond the cutoff frequency of the LPFs 16*a* and 16*b*. This enables good data decision.

EMBODIMENT 7

Figure 13:
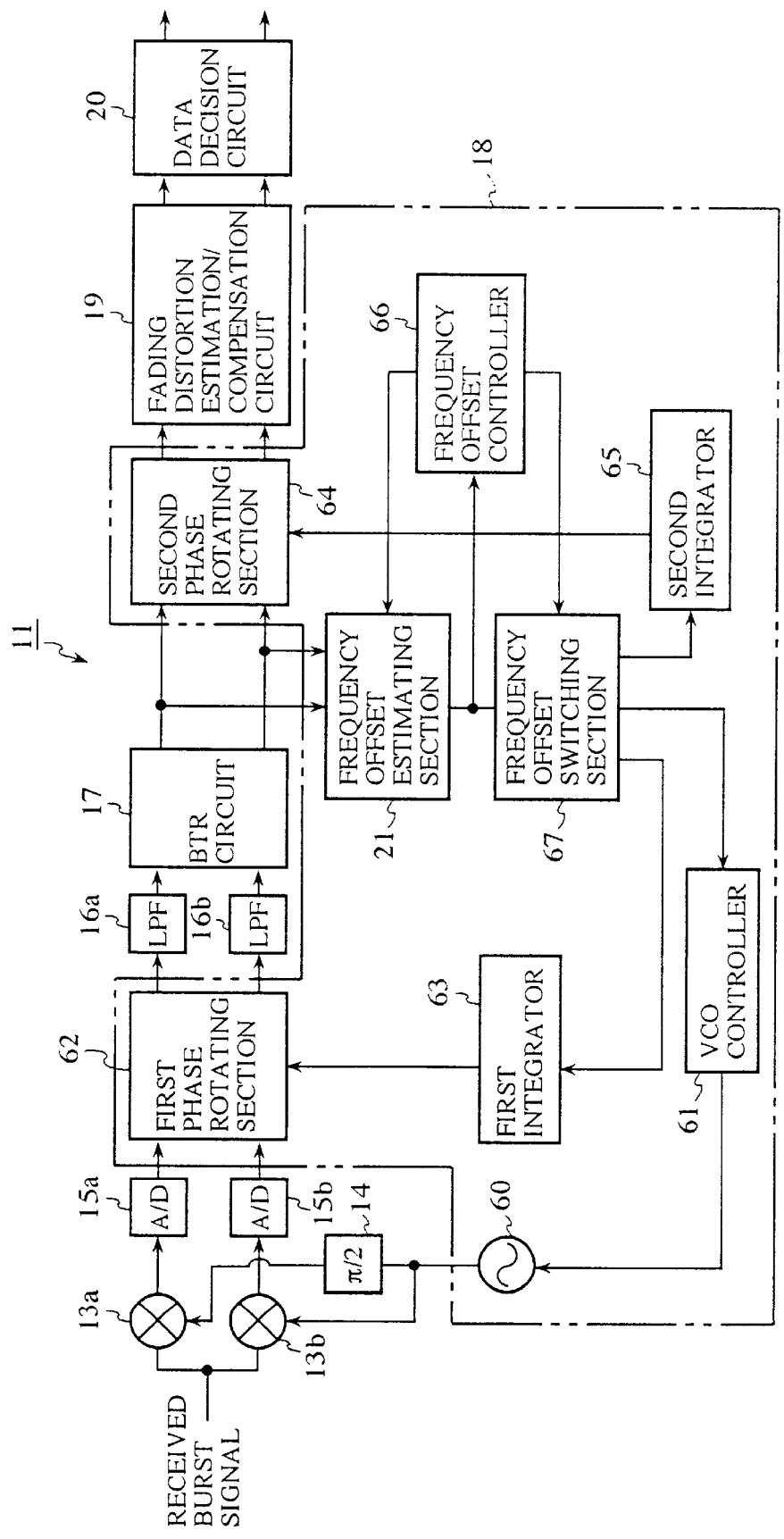
FIG. 13 is a block diagram showing a configuration of the demodulator unit of an embodiment 7 in accordance with the present invention.

FIG. 13 is a block diagram showing a configuration of the demodulator unit 11 to which the automatic frequency controller 18 of an embodiment 7 in accordance with the present invention is applied. In FIG. 13, the same functional blocks as those of FIG. 1 are designated by the same reference numerals.

In the foregoing embodiments 1–6, the frequency offset elimination of the signals is fixed either before or after the filtering processing. In contrast with this, the present embodiment 7 automatically switches the signals to be subjected to the frequency offset elimination in response to the magnitude of the frequency offset.

At the initial acquisition performed on power-up or the like, the frequency offset of the received burst signal is comparatively large, and after the initial acquisition, the frequency offset of the received burst signal is relatively small. In some cases, however, even after the initial acquisition, the frequency offset will increase or decrease in accordance with the elapse of time or the temperature.

In view of this, the demodulator unit 11 of the present embodiment 7 switches the signal to be subjected to the frequency offset elimination in and after the initial acquisition. In addition, the demodulator unit 11 switches the signal to be subjected to the frequency offset elimination after the initial acquisition in response to the magnitude of the frequency offset estimated.

More specifically, the demodulator unit 11 comprises a VCO 60 and a VCO controller 61 as a structure for eliminating the frequency offset during the initial acquisition. The VCO controller 61 controls, in response to the phase difference signal output from the frequency offset estimating section 21, the carrier frequency of the local oscillation signal generated by the VCO 60. In other words, the VCO controller 61 sets the local oscillation signal as the signal to be subjected to the frequency offset elimination.

The demodulator unit 11 further comprises a first phase rotating section 62, a first integrator 63, a second phase rotating section 64, and a second integrator 65. The first integrator 63 and second integrator 65 each integrate the phase difference in the phase difference signal output from the frequency offset estimating section 21, and supply the first phase rotating section 62 and second phase rotating section 64 with the cumulative phase difference signals, respectively. The first phase rotating section 62 and second phase rotating section 64 each eliminate the frequency offset from the digital baseband signals in response to the cumulative phase difference in the cumulative phase difference signal.

The first phase rotating section 62 is disposed before the LPFs 16*a* and 16*b*. Specifically, the first phase rotating section 62 is connected between the A/D converters 15*a* and 15*b* and the LPFs 16*a* and 16*b*. In other words, the first phase rotating section 62 handles the digital baseband signals before the filtering by the LPFs 16*a* and 16*b* as the signals to be subjected to the frequency offset elimination.

The second phase rotating section 64 is disposed after the LPFs 16*a* and 16*b*. More specifically, the second phase rotating section 64 is connected between the BTR circuit 17 and the fading distortion estimation/compensation circuit 19. In other words, the second phase rotating section 64 handles the digital baseband signals after the filtering by the LPFs 16*a* and 16*b* as the signals to be subjected to the frequency offset elimination.

The demodulator unit 11 further comprises a frequency offset controller 66 and a frequency offset switching section 67 for deciding which one of the signals is to be subjected to the frequency offset elimination. The frequency offset controller 66 makes a decision on the magnitude of the frequency offset to recognize whether the initial acquisition is completed or not. In response to the decision output of the frequency offset controller 66, the frequency offset switching section 67 makes a decision as to the destination of the phase difference signal output from the frequency offset estimating section 21.

More specifically, receiving the phase difference signal output from the frequency offset estimating section 21, the frequency offset controller 66 generates a switching signal for designating a destination of the phase difference signal in response to the phase difference signal received, and supplies the switching signal to the frequency offset switching section 67.

Figure 14:
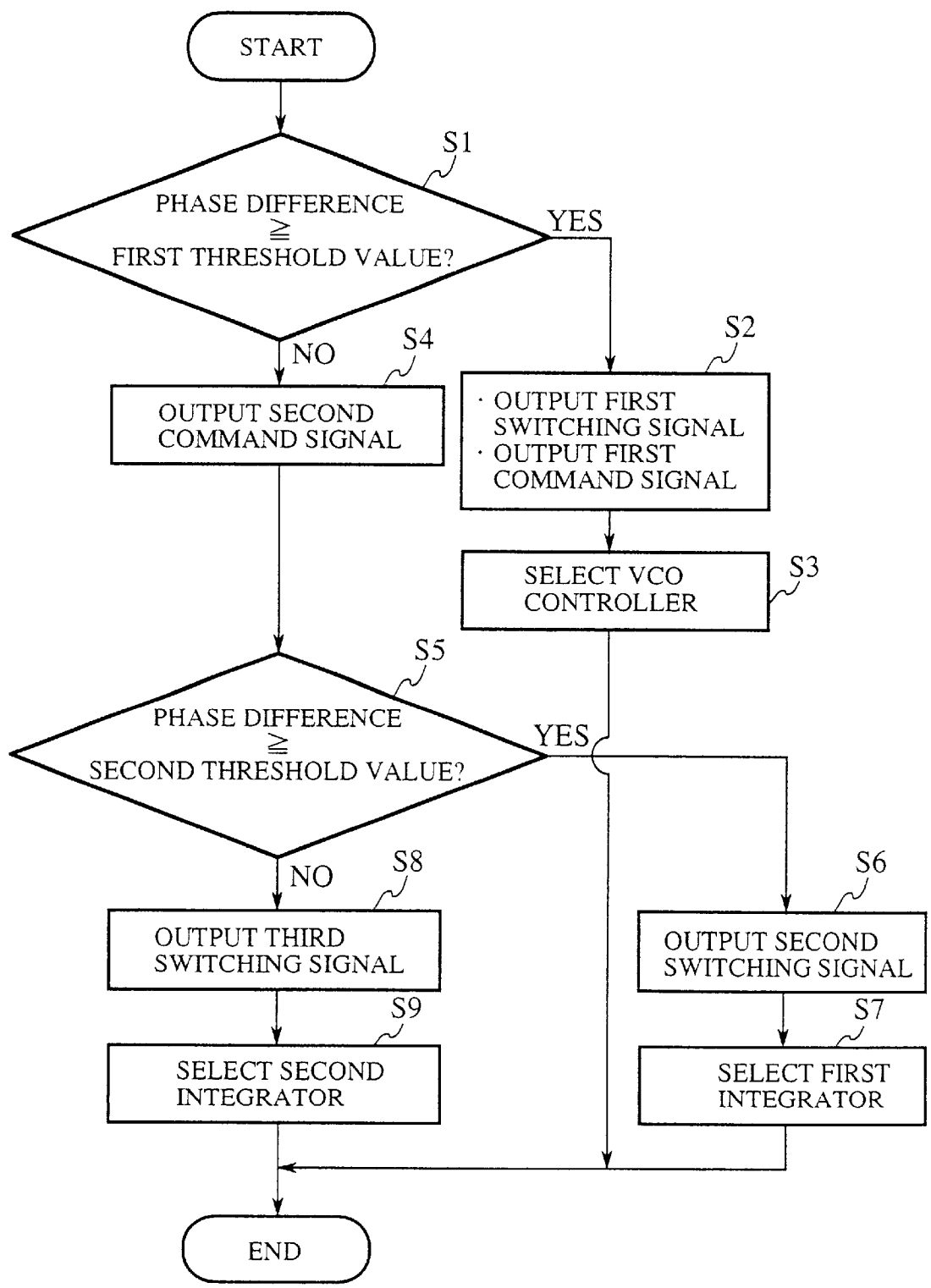
FIG. 14 is a flowchart illustrating the operation of the frequency offset controller and frequency offset switching section of the embodiment 7.

FIG. 14 is a flowchart illustrating the operation of the frequency offset controller 66 and frequency offset switching section 67. First, the frequency offset controller 66 compares the phase difference contained in the phase difference signal with a predetermined first threshold value (step S1). The first threshold value is set as a frequency value corresponding to a demarcation value between a comparatively large frequency offset expected to occur during the initial acquisition and a comparatively small frequency offset expected to take place after the initial acquisition. Accordingly, the frequency offset controller 66 can make a decision as to whether the initial acquisition is being executed or not by comparing the phase difference with the first threshold value.

If the phase difference is equal to or greater than the first threshold value (YES at step S1), it is expected that the initial acquisition is being carried out. Therefore, the frequency offset controller 66 generates the first switching signal, and supplies it to the frequency offset switching section 67 (step S2). The first switching signal designates the VCO controller 61 as the destination of the phase difference signal. Thus, the frequency offset switching section 67 supplies the phase difference signal to the VCO controller 61

(step S3). As a result, the VCO controller 61 controls in response to the phase difference the carrier frequency of the local oscillation signal generated by the VCO 60. This makes it possible to eliminate from the received burst signals the comparatively large frequency offset at the initial acquisition before the filtering processing by the LPFs 16*a* and 16*b*.

The frequency offset controller 66 also supplies the frequency offset estimating section 21 with a first command signal (step S2) at the same time when it outputs the first switching signal. The first command signal commands to maximize the frequency offset estimation range in the frequency offset estimating section 21. Receiving the first command signal, the frequency offset estimating section 21 sets the constant M in equation (8) in the foregoing embodiment 1 at its maximum.

More specifically, as described in the embodiment 1, the frequency offset estimation range $f_{DET}$ can be expressed in terms of the frequency offset estimation accuracy $\Delta f_{RES}$ as falling in the range from $-M\Delta f_{RES}$(Hz) to $M\Delta f_{RES}$(Hz) inclusive. In this case, changing the constant M enables the actually used frequency offset estimation range to be varied in the maximum frequency offset estimation range defined by the insertion period $N_P$ of the known signal.

Therefore, by setting the constant M at the maximum value, the whole frequency offset estimation range $f_{DET}$ defined by the insertion period $N_P$ of the known signal is made available as the actually used frequency offset estimation range. This ensures the frequency offset estimating section 21 to positively estimate the comparatively large frequency offset at the initial acquisition.

On the other hand, if the phase difference is less than the first threshold value (NO at step S1), the initial acquisition is considered to be completed. After the initial acquisition, the frequency offset of the received burst signals rarely reaches the level at the initial acquisition. Thus, the frequency offset controller 66 reduces the frequency offset estimation range in the frequency offset estimating section 21, first.

More specifically, the frequency offset controller 66 supplies the frequency offset estimating section 21 with a second command signal (step S4). The second command signal command the frequency offset estimating section 21 to reduce the frequency offset estimation range to a predetermined range. Receiving the second command signal, the frequency offset estimating section 21 sets the constant M at a small value.

As a result, the actually used frequency offset estimation range $f_{DET}$ is reduced, which allows the frequency offset estimating section 21 to estimate the frequency offset in a narrow range. This makes it possible to reduce the load of the frequency offset estimating section 21 as compared with the case where the frequency offset estimation range $f_{DET}$ is fixed at the maximum, and hence to employ more inexpensive circuit components.

At the same time, if the phase difference is less than the first threshold value (NO at step S1), the frequency offset controller 66 compares the phase difference with a second threshold value (step S5) which is set at a value less than the first threshold value. Specifically, the second threshold value is set at a frequency offset expected to occur when the frequency band of the received burst signal is slightly larger than the cutoff frequency of the LPFs 16*a* and 16*b*. Thus, the frequency offset controller 66 can make a decision as to whether the frequency band of the received burst signal is greater than the cutoff frequency of the LPFs 16*a* and 16*b* by comparing the phase difference with the second threshold value.

If the phase difference is less than the first threshold value and equal to or greater than the second threshold value (YES at step S5), this is considered that although the initial acquisition has been completed, the frequency band of the received burst signal is greater than the cutoff frequency of the LPFs 16*a* and 16*b*. Accordingly, the frequency offset controller 66 generates a second switching signal, and supplies it to the frequency offset switching section 67 (step S6). The second switching signal designates the first integrator 63 as the destination of the phase difference signal. Thus, the frequency offset switching section 67 supplies the phase difference signal to the first integrator 63 (step S7). As a result, the first phase rotating section 62 is supplied with the cumulative phase difference signal so that it controls the phases of the digital baseband signals before the filtering by the LPFs 16*a* and 16*b* in response to the phase difference. This makes it possible to eliminate from the received burst signals the comparatively large frequency offsets before the filtering by the LPFs 16*a* and 16*b*.

If the phase difference is less than the second threshold value (NO at step S5), this is considered that the frequency band of the received burst signals is close to the cutoff frequency of the LPFs 16*a* and 16*b*. Accordingly, the frequency offset controller 66 generates a third switching signal, and supplies it to the frequency offset switching section 67 (step S8). The third switching signal designates the second integrator 65 as the destination of the phase difference signal. Thus, the frequency offset switching section 67 supplies the phase difference signal to the second integrator 65 (step S9). As a result, the second phase rotating section 64 is supplied with the cumulative phase difference signal so that it controls the phases of the digital baseband signals after the filtering by the LPFs 16*a* and 16*b* in response to the phase difference. This makes it possible to eliminate the comparatively small frequency offsets from the received burst signals after the filtering by the LPFs 16*a* and 16*b*.

As describe above, the present embodiment 7 changes the signals to be subjected to the frequency offset elimination in response to the frequency offset estimated. This makes it possible to carry out an appropriate elimination processing matching the occurring state of the frequency offset, and to demodulate the information signal at high quality, which can improve the reception quality.

EMBODIMENT 8

Figure 15:
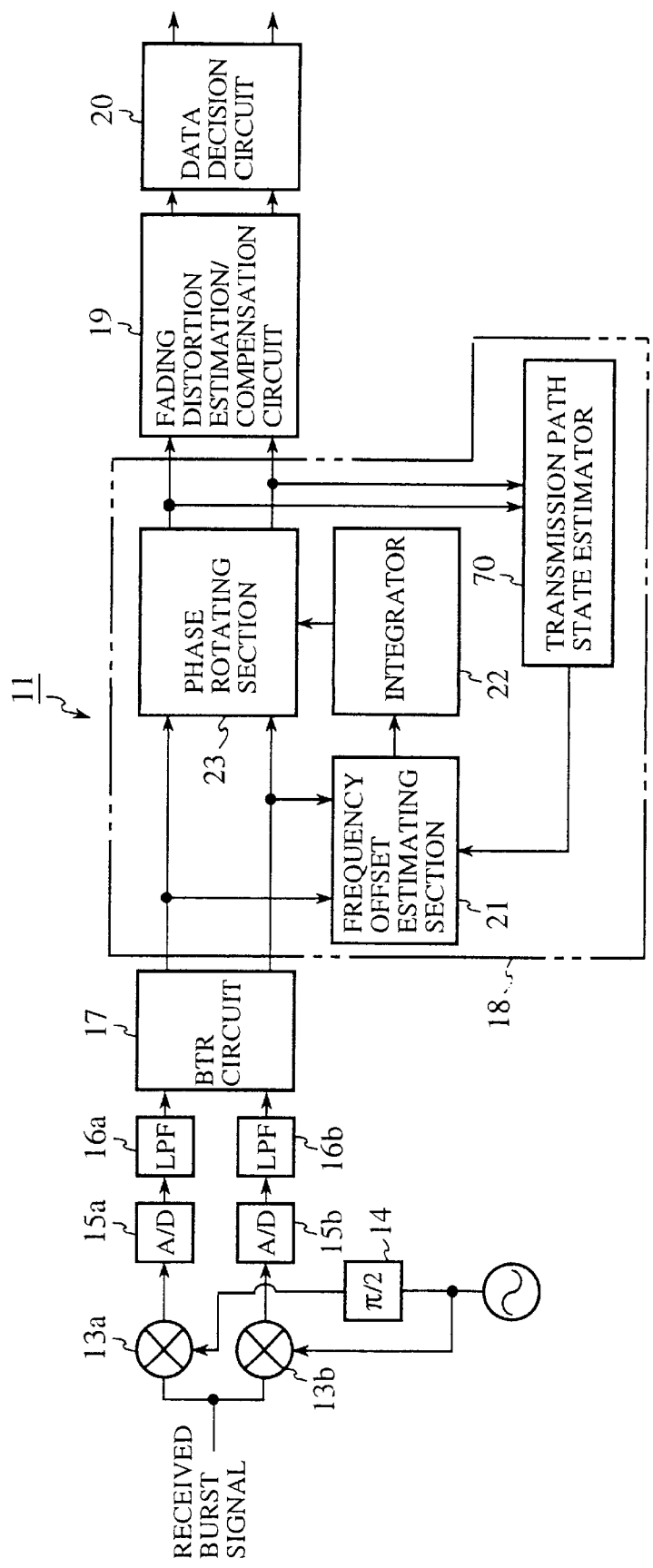
FIG. 15 is a block diagram showing a configuration of the demodulator unit of an embodiment 8 in accordance with the present invention.

FIG. 15 is a block diagram showing a configuration of the demodulator unit 11 to which the automatic frequency controller 18 of an embodiment 8 in accordance with the present invention is applied. In FIG. 15, the same functional blocks as those of FIG. 1 are designated by the same reference numerals.

In the foregoing embodiments 1–7, the object to be subjected to the frequency control is fixed to either the direct wave or the multipath waves. In contrast with this, the present embodiment 8 dynamically switches the object to be subjected to the frequency control to one of the direct wave and the multipath waves in response to a Ricean factor.

More specifically, the demodulator unit 11 comprises a transmission path state estimator 70. The transmission path state estimator 70 receives the output of the phase rotating section 23, and controls the frequency offset estimating section 21. Specifically, the transmission path state estimator 70 estimates the state of the transmission paths in response to the I-channel and Q-channel digital baseband signals output from the phase rotating section 23.

More specifically, the transmission path state estimator 70 estimates the Ricean factor from the digital baseband signals. The Ricean factor is a ratio of the signal power of the direct wave to the signal power of the multipath waves under the Ricean fading environment, and takes a greater value as the signal power of the direct wave increases. The transmission path state estimator 70 estimates the state of the transmission paths from the Ricean factor estimated, and produces a control signal to carry out the frequency offset elimination processing suitable for the state of the transmission paths.

More specifically, the transmission path state estimator 70 compares the Ricean factor with a predetermined threshold value which is set at one, for example. Thus, when the Ricean factor is equal to or greater than one, the transmission path state estimator 70 makes a decision that the signal power of the direct wave is greater. A transmission path on which the signal power of the direct wave is greater is a transmission path resembling a so-called Gaussian channel.

Taking account of this, when the Ricean factor is equal to or greater than the threshold value, the transmission path state estimator 70 generates a first control signal, and supplies it to the frequency offset estimating section 21. The first control signal is a signal for commanding to relatively narrow the width of the frequency window in the frequency offset estimating section 21.

Receiving the first control signal, the frequency offset estimating section 21 sets the parameter W at a comparatively small value. As a result, the frequency width of the frequency windows becomes relatively narrow. The frequency offset estimating section 21 carries out the frequency offset estimation in this state. This makes it possible to clearly recognize the signal power of the direct wave, and to estimate the frequency of the direct wave as the frequency offset. Thus, the frequency offset elimination processing can be carried out which is suitable to the transmission path resembling the Gaussian channel.

On the other hand, when the Ricean factor is less than the threshold value, a decision is made that the signal power of the multipath waves is greater. The transmission path on which the signal power of the multipath waves is greater is a transmission path resembling the Rayleigh fading channel. Accordingly, when the Ricean factor is less than the threshold value, the transmission path state estimator 70 generates a second control signal, and supplies it to the frequency offset estimating section 21. The second control signal, contrary to the first control signal, is a signal for commanding to relatively broaden the frequency width of the frequency window.

Receiving the second control signal, the frequency offset estimating section 21 sets the parameter W at a comparatively large value. As a result, the frequency width of the frequency windows becomes relatively wide. The frequency offset estimating section 21 carries out the frequency offset estimation in this state. This makes it possible to clearly recognize the signal power corresponding to the center frequency of the multipath waves, and to estimate the center frequency of the multipath waves as the frequency offset. Thus, the frequency offset elimination processing can be carried out which is suitable to the transmission path resembling the Rayleigh fading channel.

As describe above, the present embodiment 8 estimates the state of the transmission paths, and carries out the frequency offset elimination processing appropriate to the transmission path state. This makes it possible to better compensate for the frequency offset, and to better restore the information signal, thereby further improving the reception quality.

OTHER EMBODIMENTS

Although the embodiments in accordance with the present invention are as described above, the present invention is not limited to the foregoing embodiments. For example, although the foregoing embodiments are described taking the TDMA as an example of the communication scheme, other communication schemes such as FDMA (Frequency Division Multiple Arcess) and CDMA (Code Division Multiple Access) are also applicable. In this case, although the received signal is not a burst signal as in the TDMA but a continuous signal, the present invention can also be applied with ease.

In the case of the continuous signal, the previous average window power and average signal power to be averaged in the foregoing embodiments 2 and 3 are those obtained at the estimation time $(m-1)T$ immediately previous to the current estimation time $mT$. In other words, the average window power and average signal power are represented as $<E_j(n)>_{(m-1)T}$ and $<P_j(n)>_{(m-1)T}$, respectively.

In addition, although the foregoing embodiments assumes the number of symbols $N_P$ of the known signal to be equal to or greater than two, it may be one, for example. In this case, the frequency offset estimation cannot be achieved in a short time in a low C/N environment. However, this matters little in the environment other than the low C/N environment or in the case where the frequency offset estimation time can be prolonged.

Moreover, although the foregoing embodiments 5–8 and the two variations of the embodiments just described above employ the frequency offset estimating section 21 with the same configuration as that of the frequency offset estimating section 21 of the embodiment 1, it is obvious that the frequency offset estimating section 21 of the embodiments 2–4 is also applicable.

For example, when applying the embodiments 2 or 3 to the embodiment 8, the forgetting factor $\lambda$ may be increased or decreased so as to increase or decrease the average sampled number used in the window power averaging section 40 or signal power averaging section 45. Increasing or decreasing the forgetting factor $\lambda$ will increase or decrease the number of the previous average window powers or average signal powers used for the averaging.

More specifically, the window power averaging section 40 or signal power averaging section 45 sets the forgetting factor $\lambda$ at a relatively large value when the transmission path resembles the Gaussian channel. As a result, the number of the previous average window powers or average signal powers used for the averaging increases. This improves the estimation accuracy of the frequency offset.

On the other hand, the window power averaging section 40 or signal power averaging section 45 sets the forgetting factor $\lambda$ at a relatively small value when the transmission path resembles the Rayleigh facing channel. As a result, the number of the previous average window powers or average signal powers used for the averaging decreases. This makes it possible to well follow the temporal fluctuations of the fading.

What is claimed is:

1. An automatic frequency controller which includes a frequency offset estimating section for estimating a frequency offset of a received signal including a periodic known signal, and controls a frequency of the received signal by eliminating from the received signal the frequency offset estimated by the frequency offset estimating section, said frequency offset estimating section comprising:

phase fluctuation quantity calculation means for obtaining phase fluctuation quantity of each of a plurality of known signals included in the received signal;

signal power calculation means for obtaining, from each phase fluctuation quantity obtained by said phase fluctuation quantity calculation means, signal power corresponding to each of a plurality of candidate frequency offsets which are set at predetermined frequency offset estimation accuracy intervals in a frequency offset estimation range determined by an insertion period of the known signal;

window power calculation means for obtaining, for each of all the candidate frequency offsets in the frequency offset estimation range, window power corresponding to a predetermined candidate frequency offset within a frequency window by summing up signal powers of the candidate frequency offsets contained within the frequency window with a predetermined frequency width, the signal powers being obtained by said signal power calculation means; and estimation means for estimating as a frequency offset one of the candidate frequency offsets that corresponds to a maximum value of a plurality of the window powers obtained by said window power calculation means.

2. The automatic frequency controller according to claim 1, wherein said frequency offset estimating section further comprises window power averaging means for obtaining average window powers by averaging, using window powers obtained previously, each one of the window powers corresponding to the candidate frequency offsets; and wherein said estimation means estimates as a frequency offset one of the candidate frequency offsets corresponding to a maximum value of the average window powers obtained by said window power averaging means.

3. The automatic frequency controller according to claim 1, wherein said frequency offset estimating section further comprises signal power averaging section for obtaining average signal powers by averaging, using signal powers obtained previously, each one of signal powers corresponding to the candidate frequency offsets obtained by said signal power calculation means; and wherein said window power calculation means uses as an object to be summed up the average signal powers obtained by said signal power averaging means.

4. The automatic frequency controller according to claim 1, wherein the known signal consists of a plurality of symbols, and wherein said phase fluctuation quantity calculation means comprises means for obtaining phase fluctuation quantity of each of the plurality of symbols, and means for obtaining an average phase fluctuation quantity by averaging phase fluctuation quantities obtained.

5. The automatic frequency controller according to claim 1, wherein said frequency offset estimating section further comprises phase difference calculation means fur obtaining a phase difference corresponding to the frequency offset estimated by said estimation means; and a frequency offset elimination section for eliminating the frequency offset from the received signal by rotating the phase of the received signal in accordance with the phase difference obtained by said phase difference calculation means.

6. The automatic frequency controller according to claim 5, wherein said frequency offset estimating section further comprises phase difference averaging means for obtaining an average phase difference by averaging using phase differences obtained previously the phase difference obtained by said phase difference calculation means, and wherein said frequency offset elimination section rotates the phase of the received signal in accordance with the average phase difference.

7. The automatic frequency controller according to claim 5, wherein said frequency offset elimination section eliminates the frequency offset from the received signal by rotating a phase of a previous received signal supplied to a low-pass filter for eliminating high frequency components beyond its cutoff frequency from the received signal.

8. The automatic frequency controller according to claim 5, wherein said frequency offset elimination section comprises:

a voltage controlled oscillator for generating an oscillation signal of a predetermined oscillation frequency to be mixed with the received signal, with the oscillation frequency being varied in response to an applied voltage; and an oscillation controller for supplying to said voltage controlled oscillator a voltage for commanding to shift the oscillation frequency by an amount corresponding to the frequency offset estimated by said estimation means.

9. The automatic frequency controller according to claim 8, wherein said frequency offset elimination section comprises:

a first frequency offset elimination section for eliminating the frequency offset from the received signal before being supplied to a low-pass filter for eliminating high frequency components beyond its cutoff frequency from the received signal;

a second frequency offset elimination section for eliminating the frequency offset from the received signal after passing through said low-pass filter; and a frequency offset controller for commanding one of said oscillation controller, said first frequency offset elimination section, and said second frequency offset elimination section to carry out the frequency offset elimination in response to the frequency offset estimated by said estimation means, and wherein said frequency offset controller includes:
means for making a decision as to whether initial acquisition is being carried out;
means for having said oscillation controller perform an elimination processing of the frequency offset in the initial acquisition;
means for making a decision in response to the frequency offset estimated by said estimation means as to whether or not a frequency band of the received signal is greater than or equal to the cutoff frequency of said low-pass filter;
means for having said first frequency offset elimination section perform the elimination processing of the frequency offset when the frequency band is greater than or equal to the cutoff frequency of said low-pass filter; and
means for having said second frequency offset elimination section perform the elimination processing of the frequency offset when the frequency band is less than the cutoff frequency of said low-pass filter.

10. The automatic frequency controller according to claim 5, further comprising a transmission path state estimating section for obtaining from the received signal a ratio between power of a direct wave and power of multipath waves, wherein said window power operation means further comprises means for dynamically varies the frequency width of the frequency window in response to an estimation result by said transmission path state estimating section.

11. The automatic frequency controller according to claim 1, wherein the received signal is a burst signal in synchronism with predetermined time slots in TDMA (Time Division Multiple Access).

12. A demodulator unit comprising:

a frequency converter for converting a received signal including a periodic known signal into an analog baseband signal;

an analog-to-digital converter for converting the analog baseband signal produced by said frequency converter into a digital baseband signal;

an automatic frequency controller that includes a frequency offset estimating section for estimating a frequency offset of the digital baseband signal produced by said analog-to-digital converter, and controls a frequency of the digital baseband signal by eliminating from the digital baseband signal the frequency offset estimated by said frequency offset estimating section;

a frequency offset estimation/compensation circuit for estimating and compensating for fading distortion from the digital baseband signal after undergoing the frequency control by said automatic frequency controller; and a data decision circuit for deciding original data by demodulating the digital baseband signal having experienced the fading distortion compensation by said frequency offset estimation/compensation circuit, wherein said frequency offset estimating section comprising:

phase fluctuation quantity calculation means for obtaining phase fluctuation quantity of each of a plurality of known signals included in the received signal;

signal power calculation means for obtaining, from each phase fluctuation quantity obtained by said phase fluctuation quantity calculation means, signal power corresponding to each of a plurality of candidate frequency offsets which are set at predetermined frequency offset estimation accuracy intervals in a frequency offset estimation range determined by an insertion period of the known signal;

window power calculation means for obtaining, for each of all the candidate frequency offsets in the frequency offset estimation range, window power corresponding to a predetermined candidate frequency offset within a frequency window by summing up signal powers of the candidate frequency offsets contained within the frequency window with a predetermined frequency width, the signal powers being obtained by said signal power calculation means; and estimation means for estimating as a frequency offset one of the candidate frequency offsets corresponding to a maximum value of the plurality of the window powers obtained by said window power calculation means.

13. The demodulator unit according to claim 12, further comprising a low-pass filter for removing high frequency components beyond its cutoff frequency from the digital baseband signal produced by said analog-to-digital converter, wherein said frequency offset estimating section further comprises phase difference calculation means for obtaining a phase difference corresponding to the frequency offset estimated by said estimation means; and said automatic frequency controller further comprises a frequency offset elimination section for eliminating the frequency offset from the received signal by rotating the phase of the received signal before being supplied to said low-pass filter in accordance with the phase difference obtained by said phase difference calculation means.

* * * * *

UNITED STATES PATENT AND TRADEMARK OFFICE
CERTIFICATE OF CORRECTION

PATENT NO. : 6,353,642 B1  
DATED : March 5, 2002  
INVENTOR(S) : Takashi Asahara et al.

It is certified that error appears in the above-identified patent and that said Letters Patent is hereby corrected as shown below:

<u>Column 11,</u>  
Line 15, in equation (12), "$_{MXA}$" should be -- $_{MAX}$ --.

Signed and Sealed this

Eleventh Day of March, 2003

JAMES E. ROGAN  
*Director of the United States Patent and Trademark Office*